(12) United States Patent
Byeon

(10) Patent No.: US 9,516,771 B2
(45) Date of Patent: Dec. 6, 2016

(54) DISPLAY DEVICE COMPRISING A FILM PART WHICH COVERS A DISPLAY MODULE

(71) Applicant: LG ELECTRONICS INC., Seoul (KR)

(72) Inventor: Jonghyun Byeon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 62 days.

(21) Appl. No.: 14/593,695

(22) Filed: Jan. 9, 2015

(65) Prior Publication Data

US 2015/0373865 A1    Dec. 24, 2015

(30) Foreign Application Priority Data

Jun. 18, 2014 (KR) .................. 10-2014-0074613
Jun. 18, 2014 (KR) .................. 10-2014-0074617

(51) Int. Cl.
G02F 1/1333    (2006.01)
H05K 5/02      (2006.01)
G02F 1/1335    (2006.01)
H05K 5/00      (2006.01)

(52) U.S. Cl.
CPC ....... *H05K 5/0217* (2013.01); *G02F 1/133308* (2013.01); *G02F 1/133528* (2013.01); *H05K 5/0017* (2013.01); *G02F 2001/133311* (2013.01); *G02F 2001/133317* (2013.01)

(58) Field of Classification Search
CPC .............. G02F 1/133308; G02F 1/133608; G02F 2001/133317; G02F 2001/133311; G02F 1/133615; G02F 2201/503; G02F 2201/456

USPC ................................................... 349/58, 60
See application file for complete search history.

(56) References Cited

U.S. PATENT DOCUMENTS

| | | | |
|---|---|---|---|
| 2006/0119760 A1* | 6/2006 | Okuda | G02F 1/13452 349/58 |
| 2010/0053499 A1 | 3/2010 | Sasaki | |
| 2012/0014135 A1* | 1/2012 | Kim | G02F 1/133615 362/623 |
| 2014/0176850 A1* | 6/2014 | Kim | F21V 15/01 349/58 |
| 2014/0347597 A1* | 11/2014 | Kim | F21V 15/01 349/60 |

FOREIGN PATENT DOCUMENTS

EP    2 639 632 A1 *  9/2013  .......... G02F 1/1333
EP    2 876 491 A1     5/2015

OTHER PUBLICATIONS

European Search Report issued in Application No. 15000139.4 dated Sep. 11, 2015.

* cited by examiner

*Primary Examiner* — Mike Qi
(74) *Attorney, Agent, or Firm* — KED & Associates LLP

(57) ABSTRACT

A display device is disclosed. The display device includes a display panel including a front substrate and a back substrate, a frame disposed in the rear of the display panel, a guide panel positioned adjacent to the frame, a back cover which is disposed in the rear of the display panel and is positioned adjacent to the frame, and a film part including a first part attached to a front surface of the display panel and a second part including a portion attached to the guide panel.

20 Claims, 47 Drawing Sheets

DISPLAY DEVICE COMPRISING A FILM PART WHICH COVERS A DISPLAY MODULE

CROSS-REFERENCE TO RELATED APPLICATIONS

This application claims priority under 35 U.S.C. §119 to Korean Application Nos. 10-2014-0074613 and 10-2014-0074617, both filed on Jun. 18, 2014, whose entire disclosures are hereby incorporated by reference.

BACKGROUND

1. Field

Embodiments of the disclosure relate to a display device.

2. Background

With the development of the information society, various demands for display devices have been increasing. Various display devices, such as liquid crystal displays (LCDs), plasma display panels (PDPs), electroluminescent displays (ELDs), and vacuum fluorescent displays (VFDs), have been recently studied and used to meet various demands for the display devices. Among the display devices, a liquid crystal display panel of the liquid crystal display includes a liquid crystal layer, and a thin film transistor (TFT) substrate and a color filter substrate which are positioned opposite each other with the liquid crystal layer interposed therebetween. The liquid crystal display panel displays an image using light provided by a backlight unit of the liquid crystal display.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE EMBODIMENTS

Figure 1:
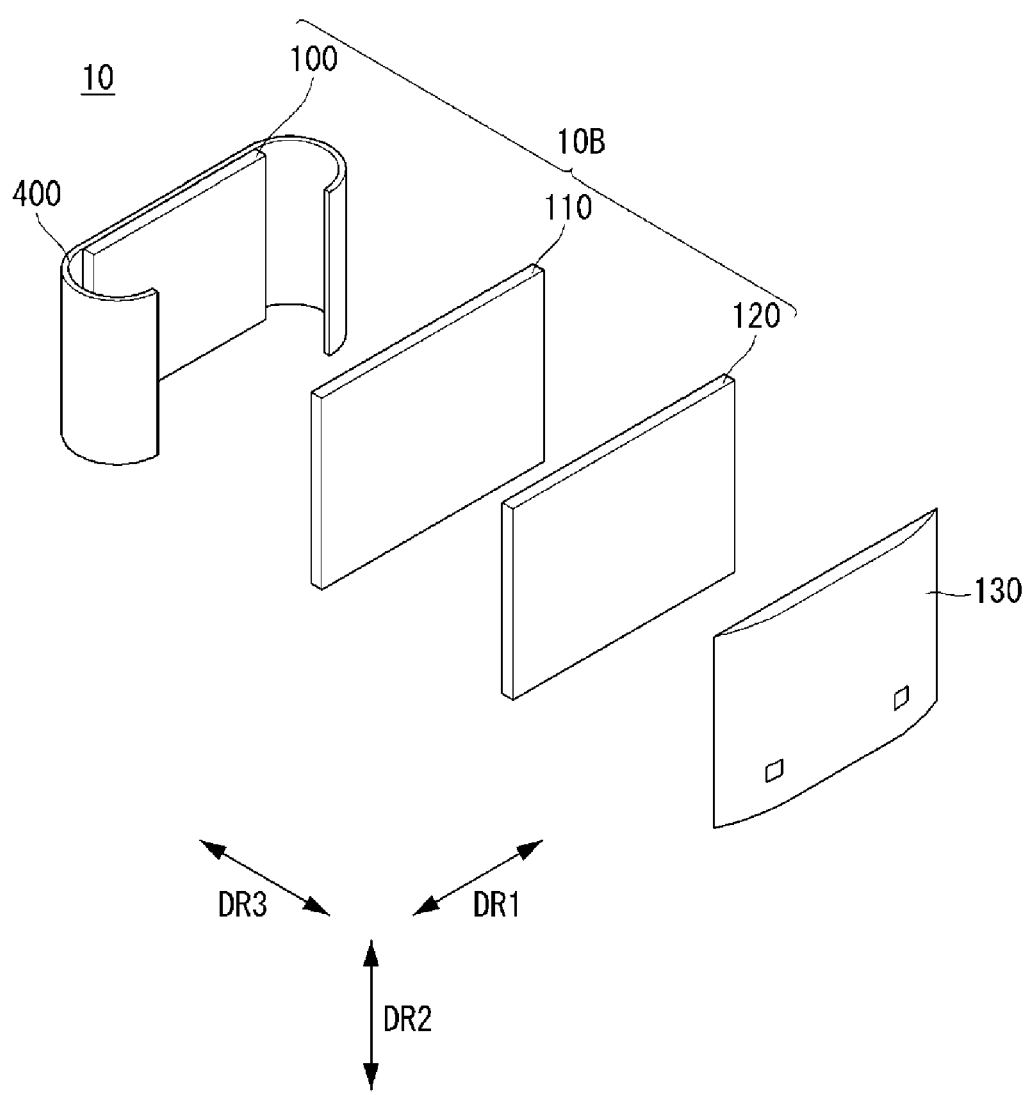
FIGS. 1 to 31 illustrate a configuration of a display device according to an exemplary embodiment of the disclosure.

Reference will now be made in detail embodiments of the disclosure examples of which are illustrated in the accompanying drawings. Since the present disclosure may be modified in various ways and may have various forms, specific embodiments are illustrated in the drawings and are described in detail in the present specification. However, it should be understood that the present disclosure are not limited to specific disclosed embodiments, but include all modifications, equivalents and substitutes included within the spirit and technical scope of the present disclosure.

The terms 'first', 'second', etc. may be used to describe various components, but the components are not limited by such terms. The terms are used only for the purpose of distinguishing one component from other components. For example, a first component may be designated as a second component without departing from the scope of the present disclosure. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component (s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present disclosure. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present disclosure pertains. The terms defined in a generally used dictionary must be understood to have meanings identical to those used in the context of a related art, and are not to be construed to have ideal or excessively formal meanings unless they are obviously specified in the present application.

The following exemplary embodiments of the present disclosure are provided to those skilled in the art in order to describe the present disclosure more completely. Accordingly, shapes and sizes of elements shown in the drawings may be exaggerated for clarity.

Hereinafter, a liquid crystal display panel is used as an example of a display panel. Other display panels may be used. For example, a plasma display panel (PDP), a field emission display (FED) panel, an organic light emitting display panel, or another appropriate type of display panel may be used.

In the following description, a display panel may include a first long side LS1, a second long side LS2 opposite the first long side LS1, a first short side SS1 adjacent to the first long side LS1 and the second long side LS2, and a second short side SS2 opposite the first short side SS1.

Further, in the following description, the first short side SS1 may be referred to as a first side area; the second short side SS2 may be referred to as a second side area opposite the first side area; the first long side LS1 may be referred to as a third side area which is adjacent to the first side area and the second side area and is positioned between the first side area and the second side area; and the second long side LS2 may be referred to as a fourth side area which is adjacent to the first side area and the second side area, is positioned between the first side area and the second side area, and is opposite the third side area.

The embodiment of the disclosure describes that lengths of the first and second long sides LS1 and LS2 are longer than lengths of the first and second short sides SS1 and SS2 for the sake of brevity and ease of reading. However, the lengths of the first and second long sides LS1 and LS2 may be almost equal to the lengths of the first and second short sides SS1 and SS2.

In the following description, a first direction DR1 may be a direction parallel to the long sides LS1 and LS2 of the display panel, and a second direction DR2 may be a direction parallel to the short sides SS1 and SS2 of the display panel. Further, a third direction DR3 may be a direction vertical to the first direction DR1 and/or the second direction DR2.

In the embodiments of the disclosure, the first direction DR1 and the second direction DR2 may be commonly referred to as a horizontal direction. Further, the third direction DR3 may be referred to as a vertical direction.

FIGS. 1 to 31 illustrate configuration of a display device according to an exemplary embodiment of the disclosure.

As shown in FIG. 1, a display device 10 according to the embodiment of the disclosure may include a display module 10B including a display panel 100, an optical layer 110, a film part 400, and a frame 120, and a back cover 130 positioned in rear of the display module 10B. The back cover 130 may be connected to the display module 10B.

The embodiment of the disclosure describes that the display module 10B includes the display panel 100, the optical layer 110, the film part 400, and the frame 120, as an example. However, configuration of the display module 10B may be variously changed. For example, the display module 10B may include the display panel 100, the optical layer 110, and the frame 120, and the film part 400 may be attached to a front surface of the display module 10B.

The display panel 100 for displaying an image may include a front substrate 101 and a back substrate 111, which are positioned opposite each other. The optical layer 110 may be disposed between the display panel 100 and the back cover 130. The optical layer 110 may include a plurality of sheets. For example, although not shown, the optical layer 110 may include at least one of a prism sheet and a diffusion sheet.

The frame 120 may be disposed in the rear of the optical layer 110. A driving board for driving the display panel 100 may be disposed on the frame 120. The frame 120 may contain a metal material, for example, aluminum. Further, although not shown, a light source unit including at least one light source may be disposed on the frame 120. The back cover 130 may be disposed in rear of the frame 120. The back cover 130 may be connected to the frame 120.

Figure 2:
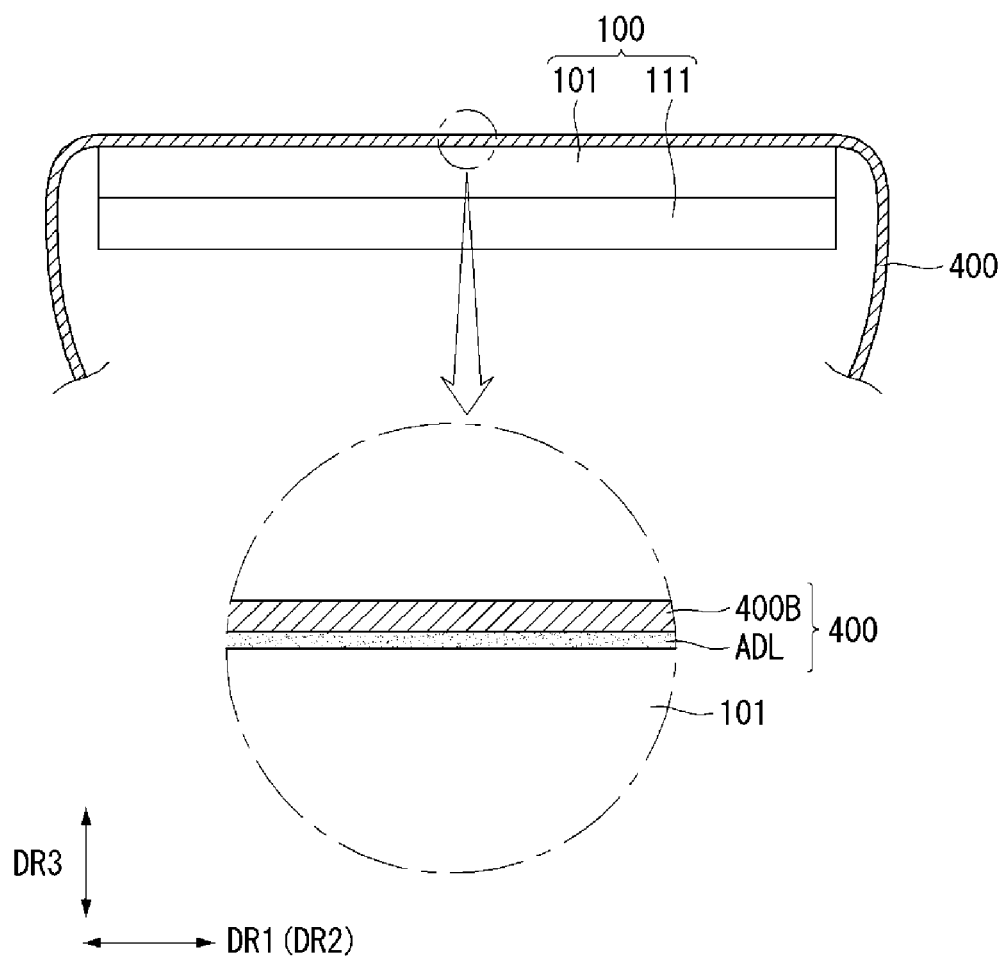

As shown in FIG. 2, the display panel 100 may include the front substrate 101 and the back substrate 111, which are positioned opposite each other and are attached to each other while maintaining a uniform cell gap therebetween. A liquid crystal layer may be formed between the front substrate 101 and the back substrate 111. A seal part may be formed between the front substrate 101 and the back substrate 111 to seal the liquid crystal layer.

A color filter for representing red, green, and blue colors may be positioned on the front substrate 101. The color filter may include a plurality of pixels including red, green, and blue subpixels. When light is incident on the color filter, the color filter may generate images corresponding to the red, green, or blue color.

The pixels may include the red, green, and blue subpixels, but are not limited thereto. For example, red, green, blue, and white subpixels may configure one pixel, and various combinations of the subpixels may be used.

A predetermined transistor for turning on or off liquid crystals in each pixel, for example, a thin film transistor (TFT) may be formed on the back substrate 111. Hence, the front substrate 101 may be referred to as a color filter substrate, and the back substrate 111 may be referred to as a TFT substrate.

The liquid crystal layer may include a plurality of liquid crystal molecules, and the arrangement of the liquid crystal molecules may change by a driving signal supplied by the transistor. Hence, light provided by the light source unit may be incident on the color filter based on changes in the arrangement of the liquid crystal molecules of the liquid crystal layer. As a result, the color filter may implement red, green, and blue light, and a predetermined image may be displayed on the front substrate 101 of the display panel 100.

Since the above-described structure and configuration of the display panel 100 are merely an example, they may be changed, added, or omitted. For example, the color filter for representing the red, green, and blue colors may be positioned on the back substrate 111, and the TFT may be formed on the front substrate 101. In this instance, the back substrate 111 may be referred to as the color filter substrate, and the front substrate 101 may be referred to as the TFT substrate.

As shown in FIG. 2, the film part 400 may be attached to a front surface of the display panel 100. For this, the film part 400 may include a film layer 400B and an adhesive layer ADL formed on the film layer 400B. The film part 400 may be attached to the display panel 100 through the adhesive layer ADL. For example, the film part 400 may be attached to the front substrate 101 of the display panel 100. Further, the film part 400 may cover the side of the display module 10B. This is described in detail later.

Figure 3:
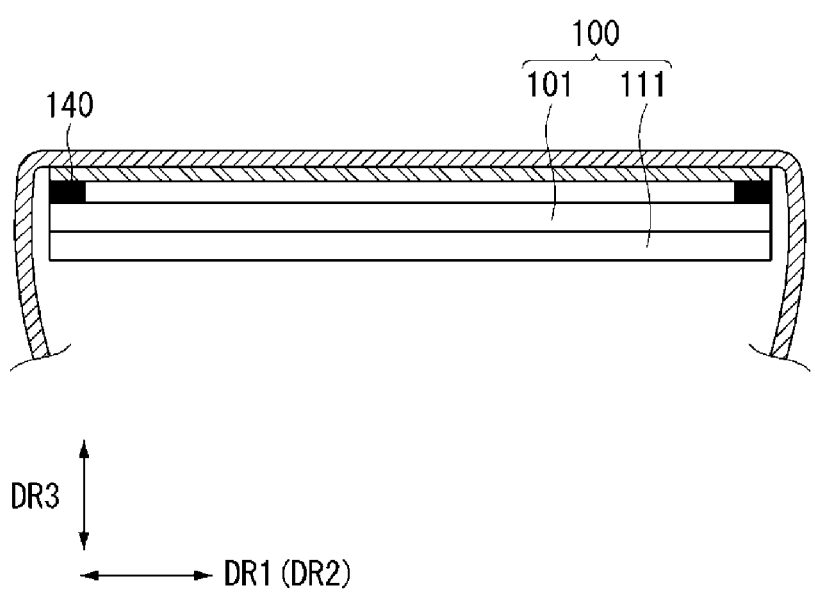

As shown in FIG. 3, the display module 10B may include a substrate 140 positioned in front of the display panel 100. The substrate 140 may be a glass substrate or a plastic substrate capable of transmitting light. As described above, when the display module 10B further includes the substrate 140, the film part 400 may be attached to a front surface of the substrate 140.

The embodiment of the disclosure describes the film part 400 attached to the front substrate 101 for the sake of brevity and ease of reading, as an example. However, the embodiment of the disclosure may be variously changed. For example, the film part 400 may be attached to the substrate 140.

The film part 400 may include a portion 410 attached to the front surface of the display panel 100. Hereinafter, the portion 410 of the film part 400 attached to the display panel 100 may be referred to as a first part 410.

A partial area of the first part 410 of the film part 400 may transmit light. For example, as shown in (A) of FIG. 4, the first part 410 of the film part 400 may include a transparent portion 400TS and an opaque portion 400BL.

The opaque portion 400BL may be positioned at an edge of the transparent portion 400TS, and a light transmittance of the transparent portion 400TS may be greater than a light transmittance of the opaque portion 400BL. The opaque portion 400BL may have a shape surrounding the transparent portion 400TS. The opaque portion 400BL may prevent light provided by the light source unit from leaking into an area other than a display area.

Figure 4:
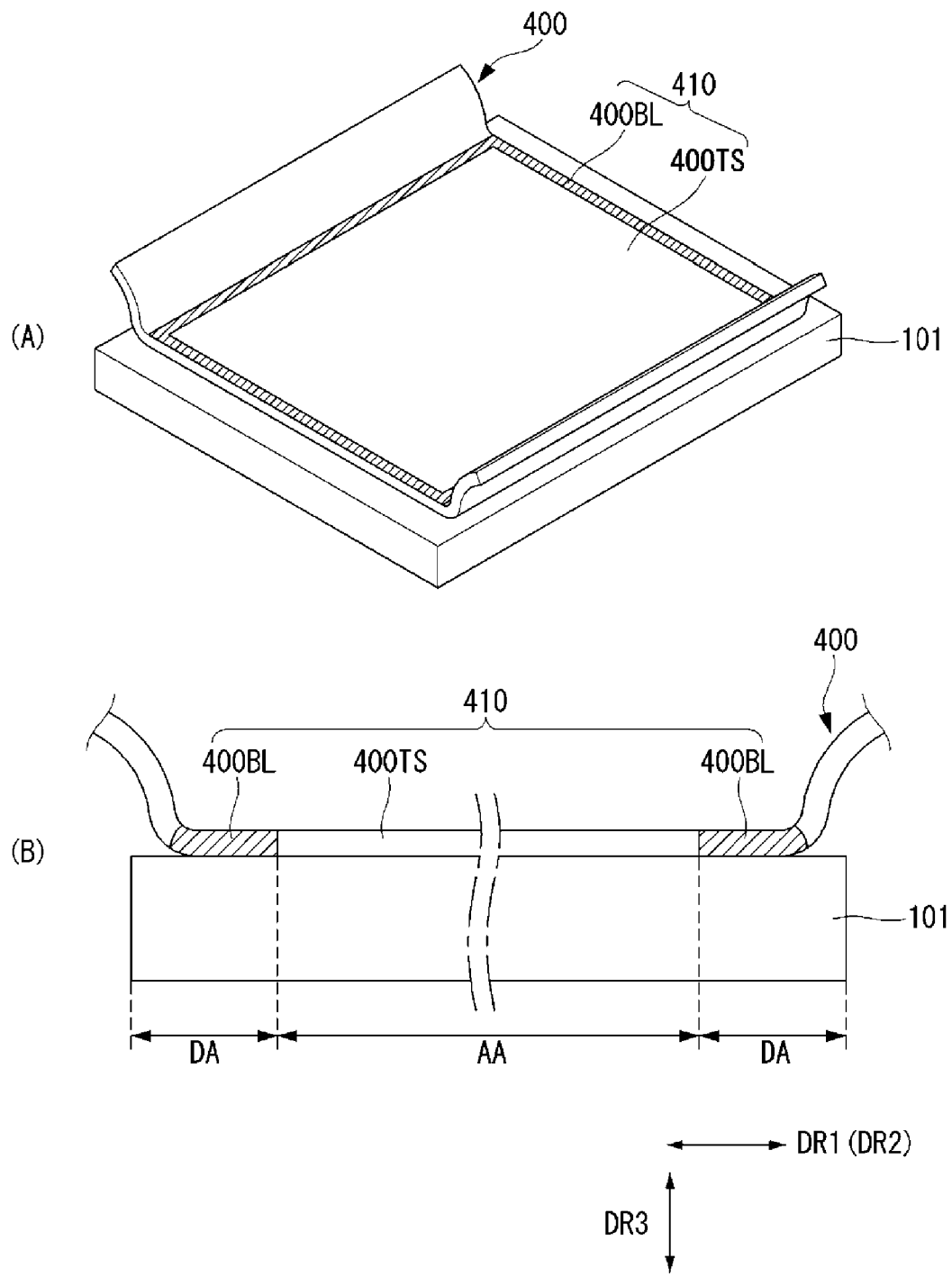

As shown in (B) of FIG. 4, the transparent portion 400TS of the first part 410 of the film part 400 may correspond to an active area AA of the display panel 100, on which an image is displayed. The opaque portion 400BL of the first part 410 of the film part 400 may correspond to a dummy area DA outside the active area AA of the display panel 100.

The opaque portion 400BL of the film part 400 may be darker than the transparent portion 400TS, so as to reduce reflection of light. For example, the opaque portion 400BL of the film part 400 may be almost black. For this, the opaque portion 400BL may include a dye.

Figure 5:
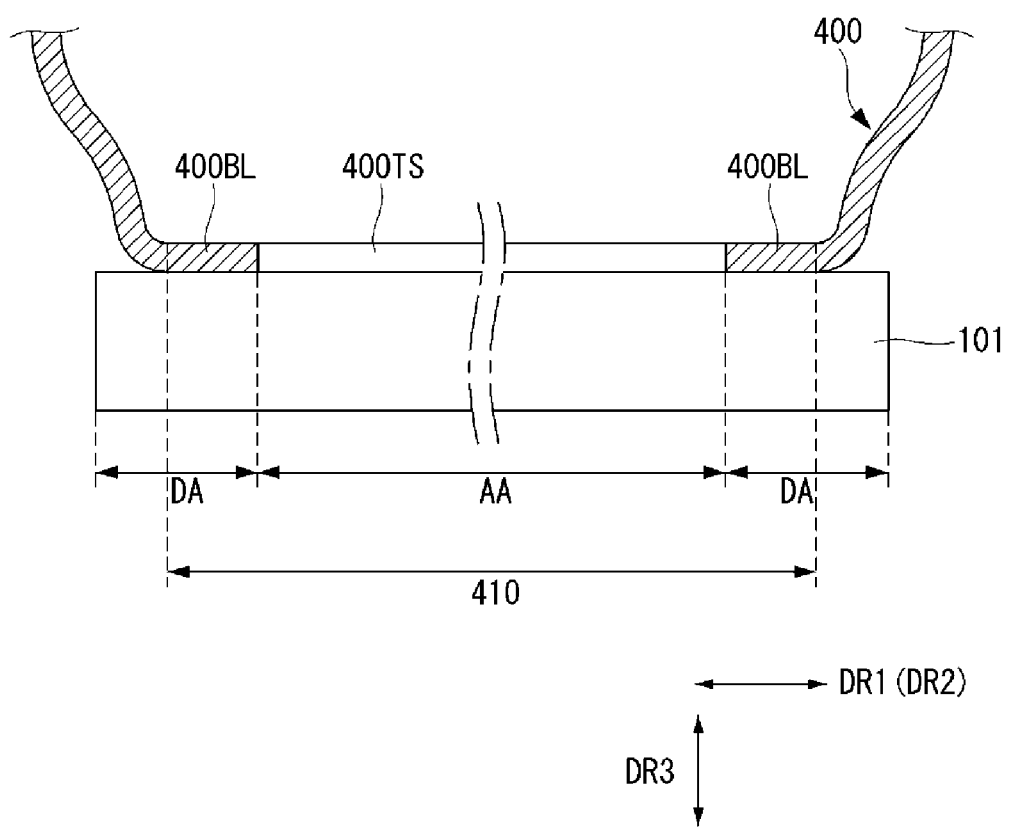

As shown in (B) of FIG. 4, a portion of the film part 400 corresponding to the dummy area DA of the display panel 100 may include a dye. Alternatively, as shown in FIG. 5, a portion except a portion of the film part 400 corresponding to the active area AA of the display panel 100 may include the dye. In this instance, a portion except the first part 410 of the film part 400 may include the dye.

Figure 6:
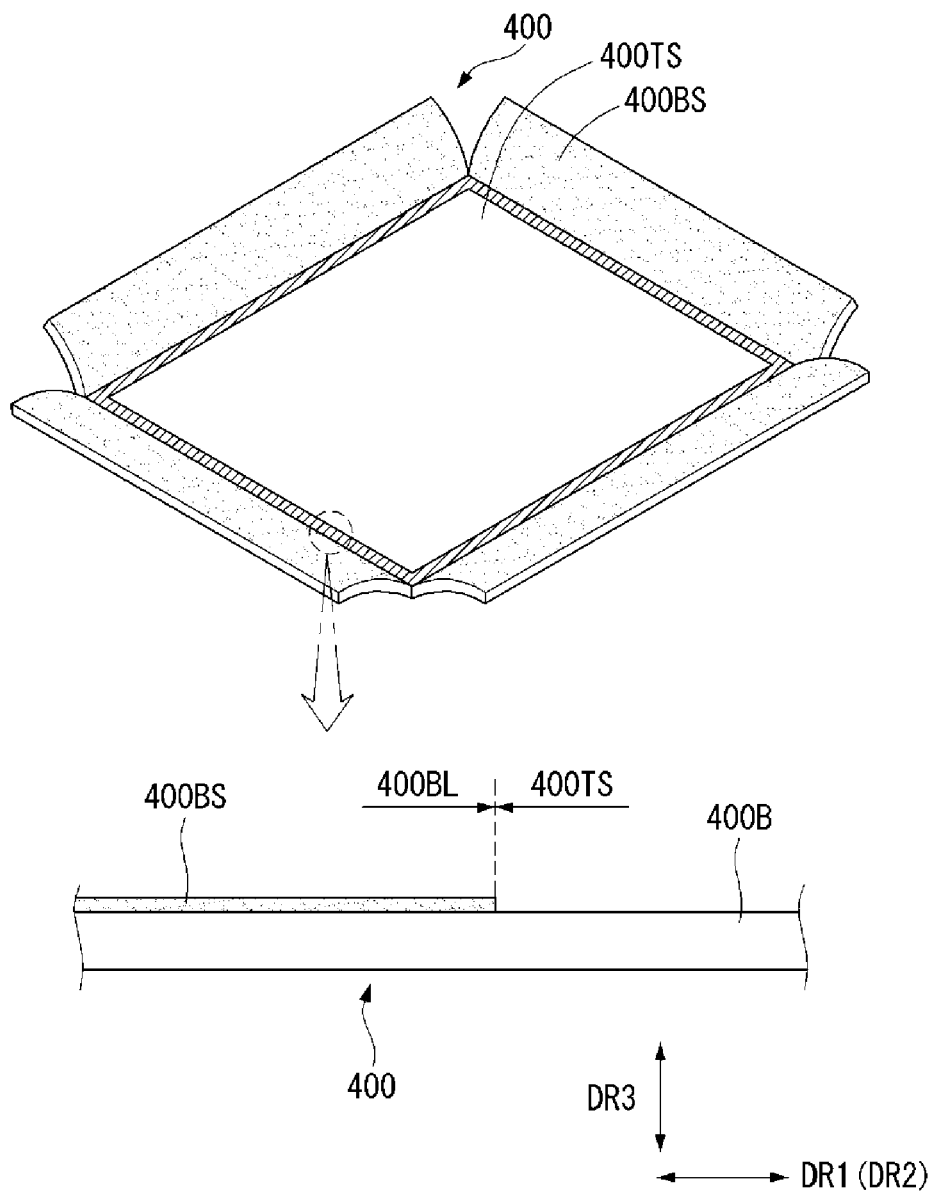

The opaque portion 400BL of the film part 400 may be formed through methods other than the method for forming the opaque portion 400BL using the dye as described above. For example, as shown in FIG. 6, a black paint may be applied to a predetermined portion of the film part 400 to form the opaque portion 400BL. Alternatively, as shown in FIG. 6, a black sheet 400BS may be attached to a predetermined portion of the film part 400 to form the opaque portion 400BL.

Figure 7:
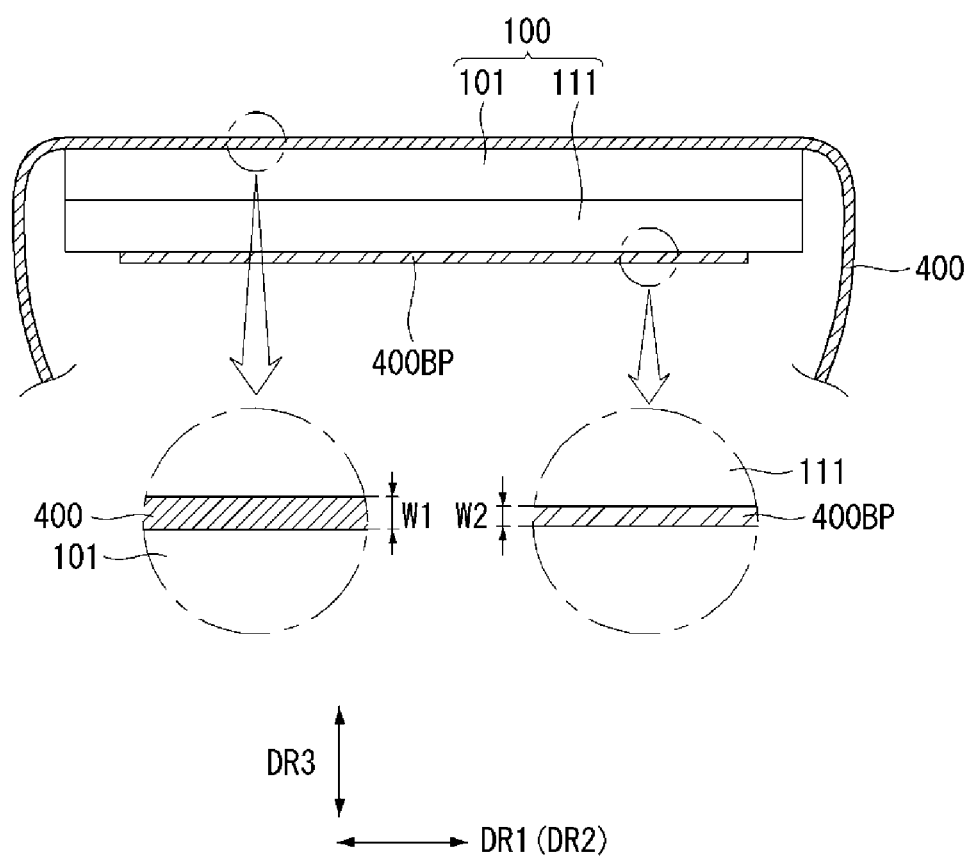

As shown in FIG. 7, a polarizer 400BP may be attached to a back surface of the back substrate 111. The polarizer 400BP attached to the back surface of the back substrate 111 may be referred to as a back polarizer 400BP.

The film part 400 attached to the front surface of the display panel 100 may include a polarizer. Hence, the film part 400 may be referred to as a front polarizer.

It may be preferable, but not required, that the film part 400 is thick enough to surround the side of the display module 10B. Hence, a thickness W1 of the film part 400 may be greater than a thickness W2 of the back polarizer 400BP. Further, the total area of the film part 400 may be greater than the total area of the back polarizer 400BP.

Figure 8:
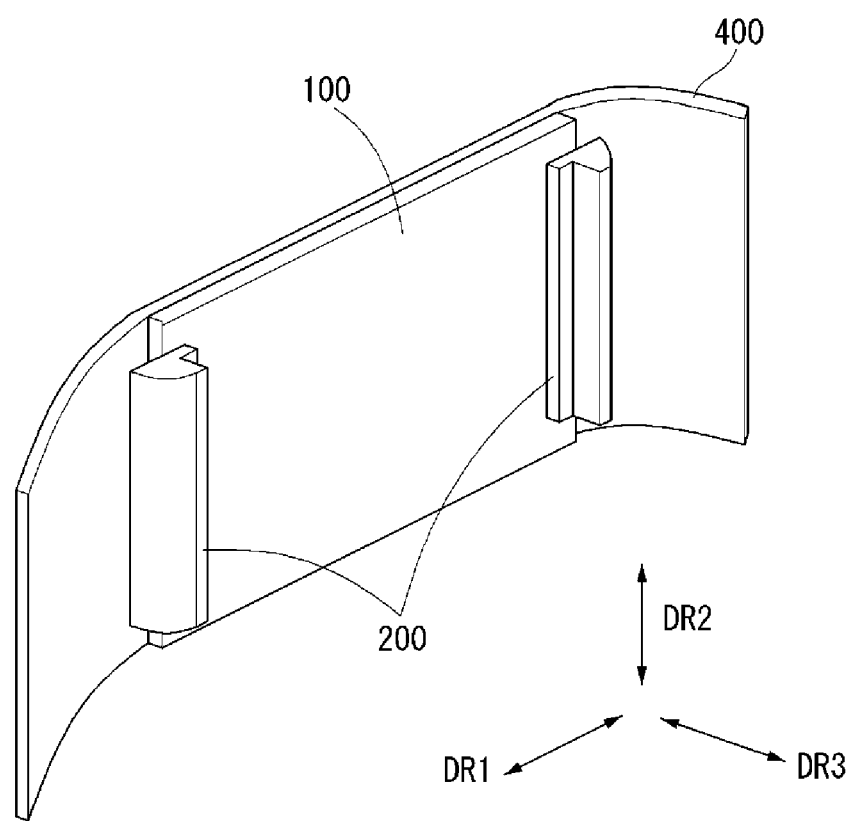

As shown in FIG. 8, a guide panel 200 may be disposed on a back surface of the display panel 100, e.g., on the back surface of the back substrate 111. The guide panel 200 may support the film part 400 at the side of the display module 10B. The guide panel 200 may be attached to the back surface of the back substrate 111.

Figure 9:
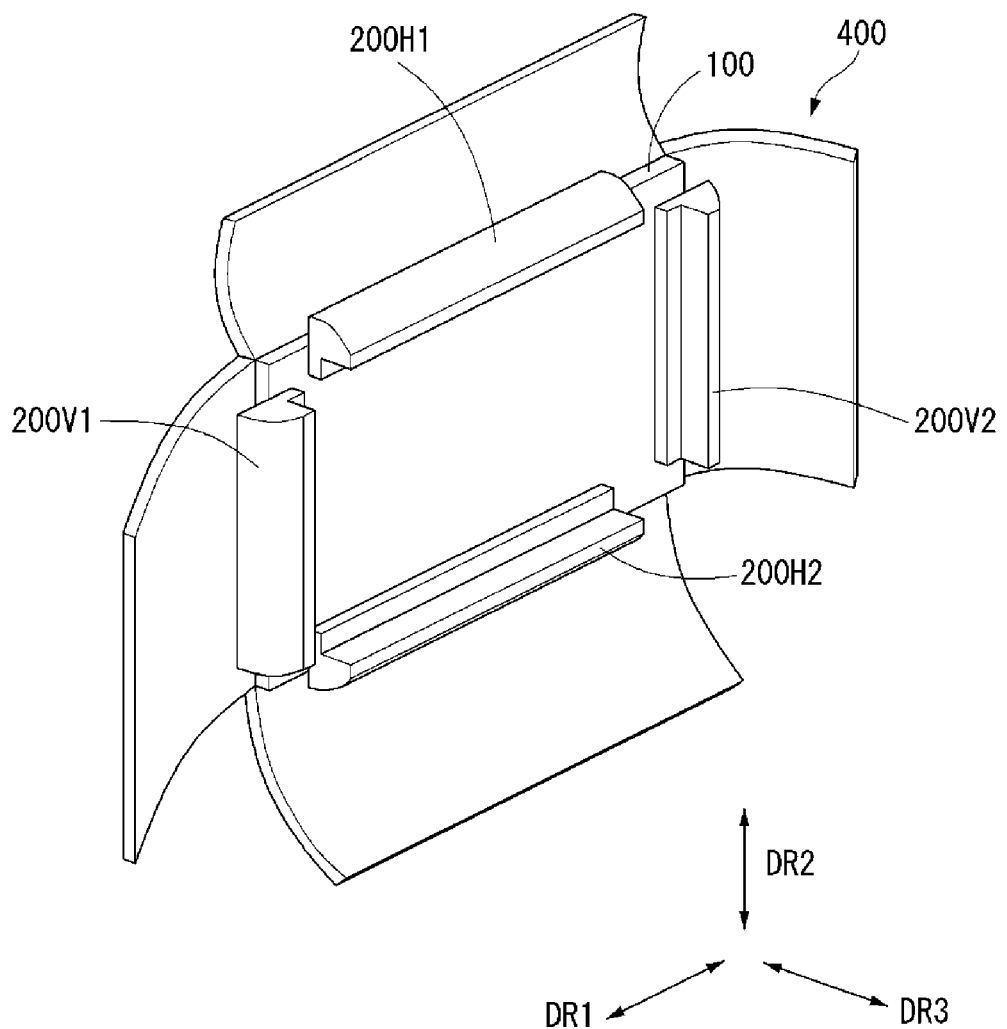

As shown in FIG. 9, the guide panel 200 may be disposed on the long sides as well as the short sides of the display panel 100. The disposition and the number of guide panel 200 according to the embodiment of the disclosure are not limited to FIGS. 8 and 9.

Figure 10:
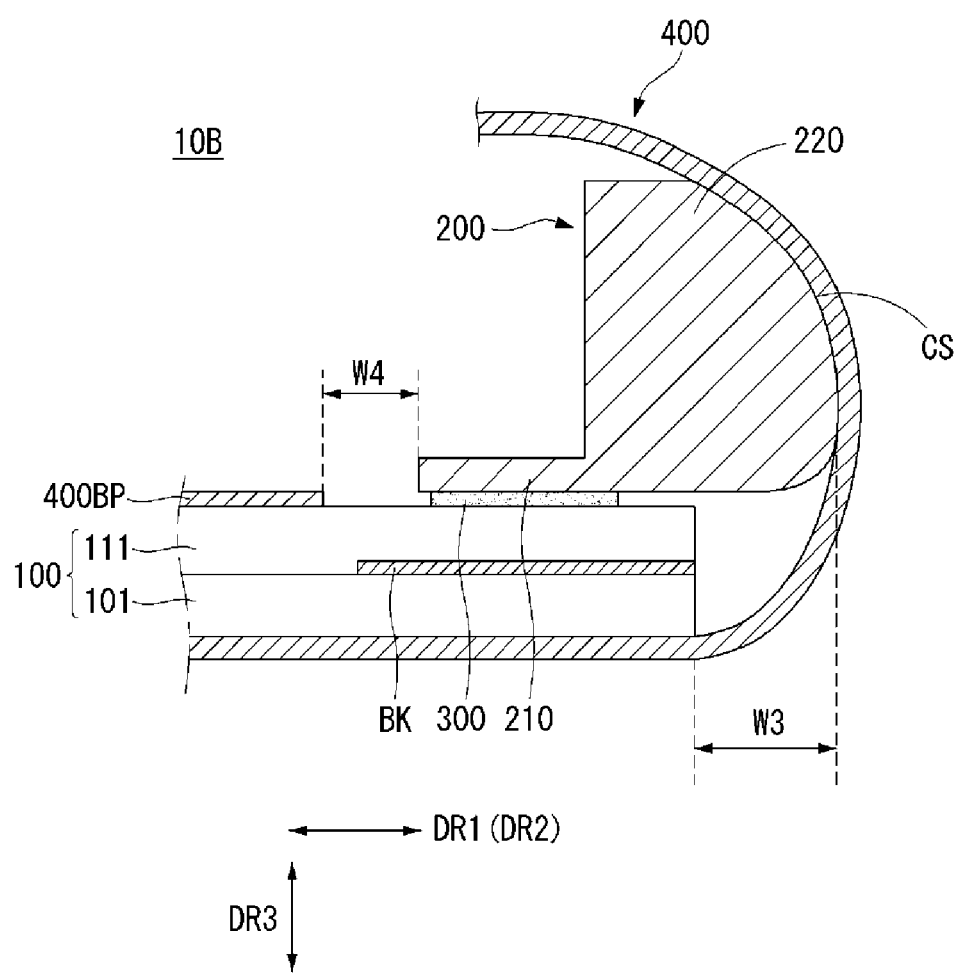

As shown in FIG. 10, an adhesive layer 300 may be disposed between the back substrate 111 and the guide panel 200. Hereinafter, the adhesive layer 300 between the back substrate 111 and the guide panel 200 may be referred to as a first adhesive layer.

The display panel 100 may further include a black layer BK between the front substrate 101 and the back substrate 111. The guide panel 200 may overlap the black layer BK.

The guide panel 200 may include a portion protruding further than the display panel 100 by a predetermined distance W3 in the horizontal direction (e.g., the first direction DR1 and/or the second direction DR2). The protruding portion of the guide panel 200 may include a curved surface CS.

In this instance, even when the film part 400 has sufficiently large rigidity, the curved surface CS of the guide panel 200 may be easily covered with the film part 400 while preventing damage to the film part 400.

Namely, the film part 400 may cover the curved surface CS of the guide panel 200. Hence, the film part 400 may include a bending portion that covers the side of the guide panel 200.

The guide panel 200 and the back polarizer 400BP may be separated from each other by a predetermined distance W4 in the horizontal direction (e.g., the first direction DR1 and/or the second direction DR2).

The guide panel 200 may include a horizontal part 210 extending in the horizontal direction (e.g., the first direction DR1 and/or the second direction DR2) and a vertical part 220 extending from the horizontal part 210 in the vertical direction (e.g., the third direction DR3). The vertical part 220 of the guide panel 200 may have the curved surface CS.

Figure 11:
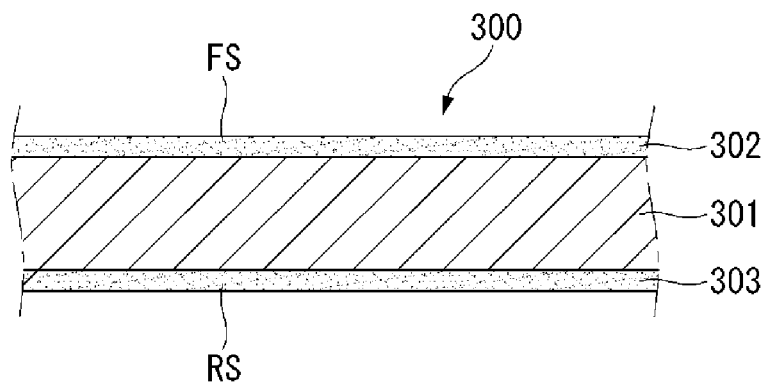

As shown in FIG. 11, the adhesive layer 300 attaching the guide panel 200 to the back surface of the display panel 100 may include a base layer 301, a first layer 302 which is formed on a first surface FS of the base layer 301 and has the adhesion, and a second layer 303 which is formed on a second surface RS of the base layer 301 and has the adhesion.

It may be preferable, but not required, that the base layer 301 is formed of a material with elasticity. For example, the base layer 301 may be formed of urethane foam.

The adhesive layer 300 having the above-described configuration may have the elasticity and the flexibility as well as the adhesion. Hence, the adhesive layer 300 may absorb an external force applied through the guide panel 200, and thus may prevent the external force from being transferred to the display panel 100.

Figure 12:
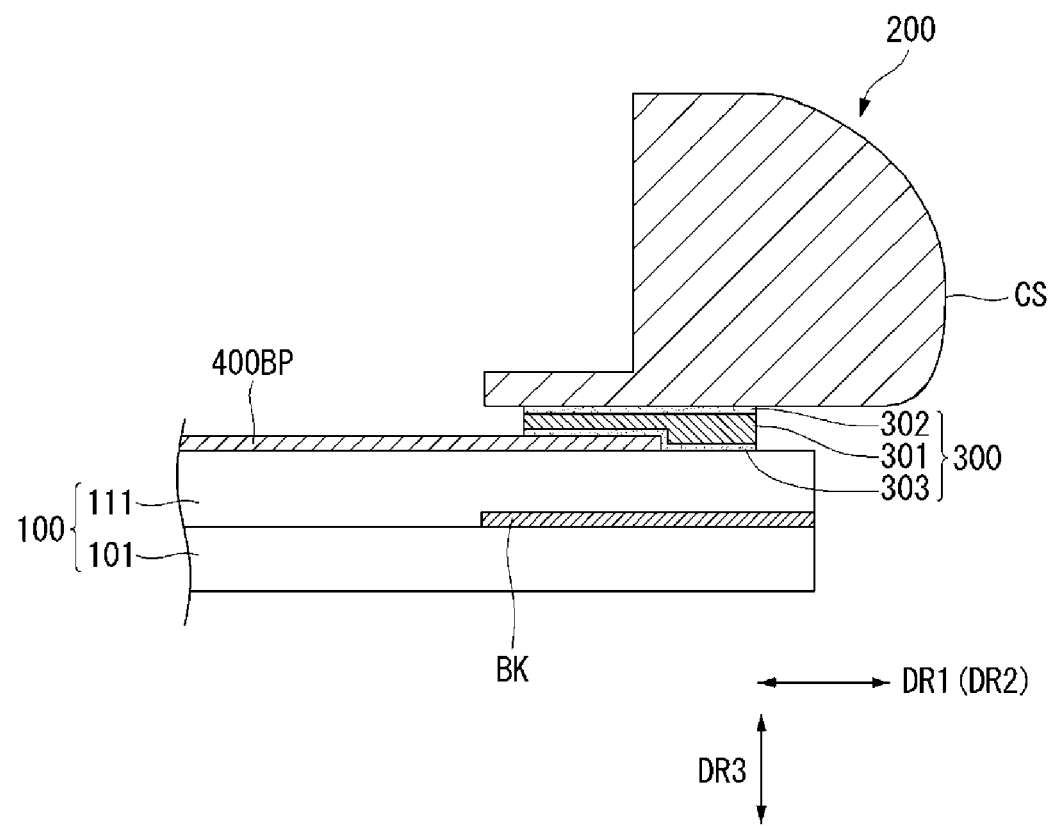

The adhesive layer 300 having the above-described configuration may be referred to as a foam pad. When the guide panel 200 is attached to the back surface of the display panel 100 through the foam pad type adhesive layer 300, the adhesive layer 300 may sufficiently have the elasticity. Hence, as shown in FIG. 12, the adhesive layer 300 may overlap the back polarizer 400BP in the vertical direction (e.g., the third direction DR3).

Figure 13:
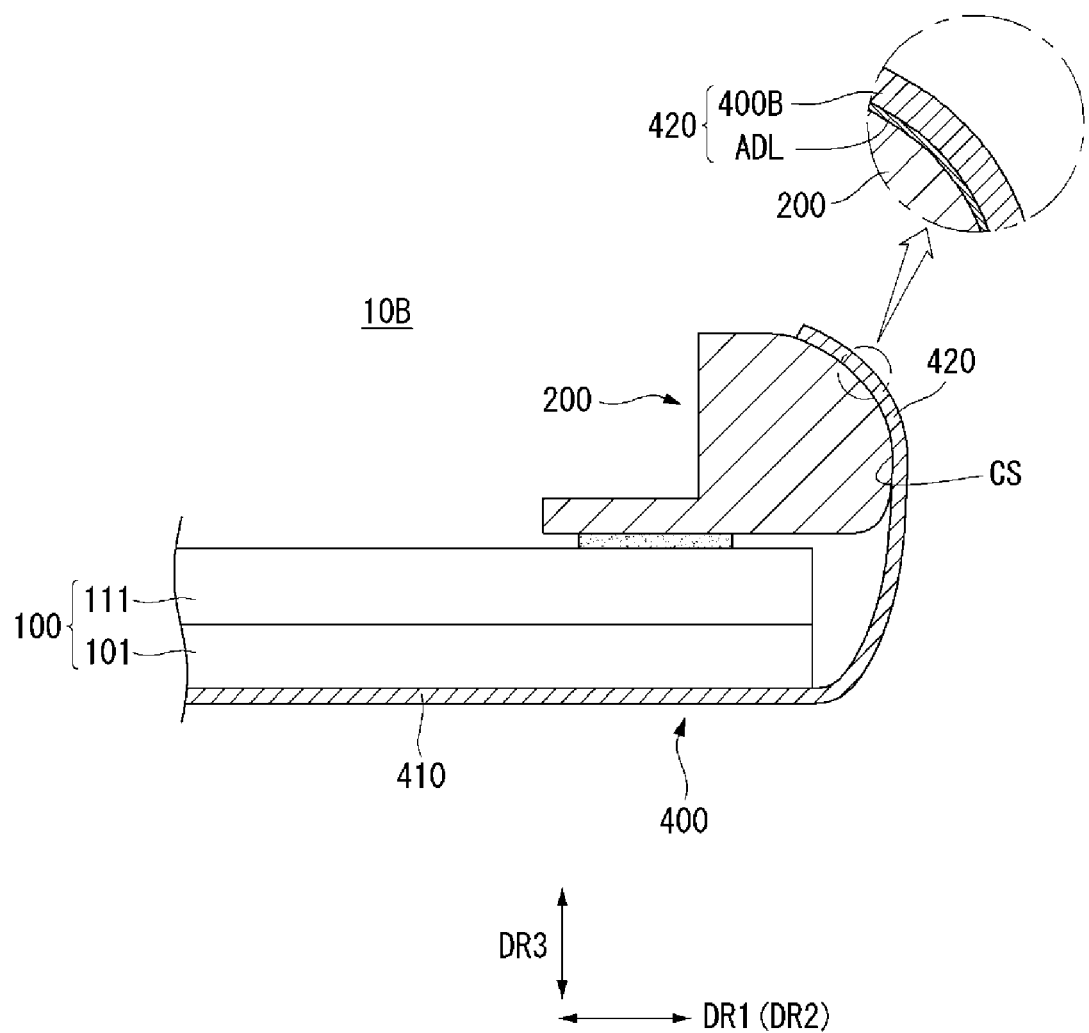

As shown in FIG. 13, the film part 400 may include a first part 410 (or first portion or region) attached to the front surface of the display panel 100 and a second part 420 (or second portion or region) attached to the guide panel 200. It may be preferable, but not required, that the second part 420 is attached to the curved surface CS of the guide panel 200.

An adhesive layer ADL may be formed between the guide panel 200 and the second part 420 of the film part 400, so as to attach the second part 420 to the guide panel 200. Alternatively, the adhesive layer ADL may be formed between a film layer 400B of the film part 400 and the guide panel 200.

Further, a lamination method may be used to attach the film part 400 to the guide panel 200. Hence, the film part 400 may be efficiently attached to the curved surface CS of the guide panel 200 using the lamination method.

Figure 14:
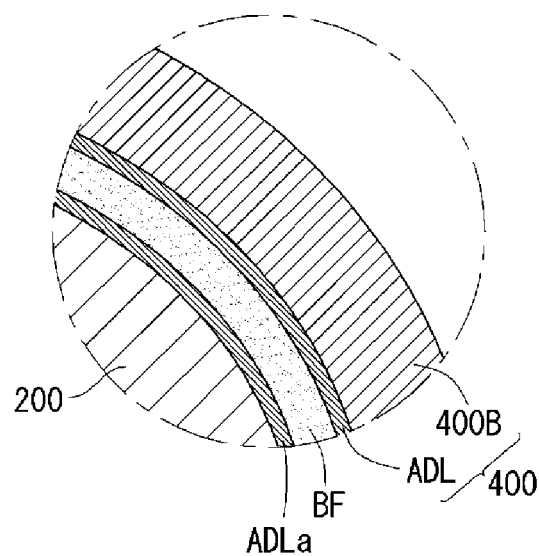

As shown in FIG. 14, a buffer BF with the elasticity may be formed between the guide panel 200 and the film part 400. For this, another adhesive layer ADLa may be formed between the buffer BF and the guide panel 200.

Before the film part 400 is laminated on the curved surface CS of the guide panel 200, the buffer BF may be attached to the curved surface CS of the guide panel 200. Hence, a lamination process of the film part 400 may be more easily performed, and the film part 400 may be precisely attached to the curved surface CS of the guide panel 200.

Figure 15:
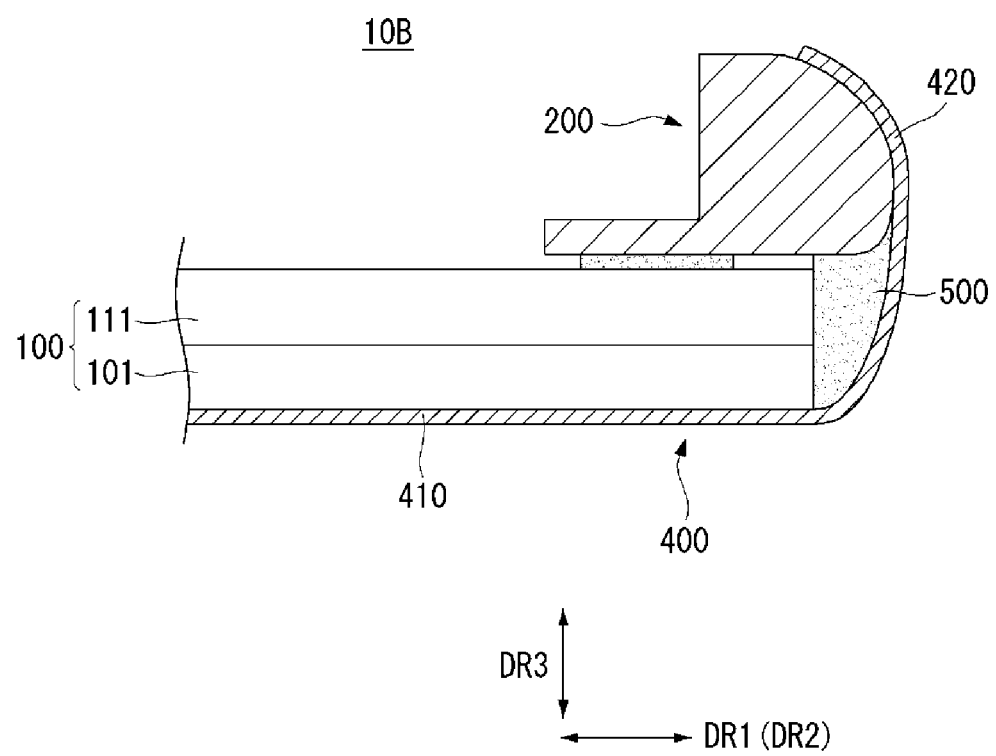

As shown in FIG. 15, a resin layer 500 may be formed on the side of the display panel 100, e.g., the side of the front substrate 101 and/or the side of the back substrate 111. The resin layer 500 may prevent the film part 400 from sharply bending at an end of the display panel 100. The resin layer 500 may contain a resin material and a photosensitive material. In this instance, time required in a formation process of the resin layer 500 may be reduced. The resin layer 500 may commonly contact the display panel 100, the guide panel 200, and the film part 400.

Figure 16:
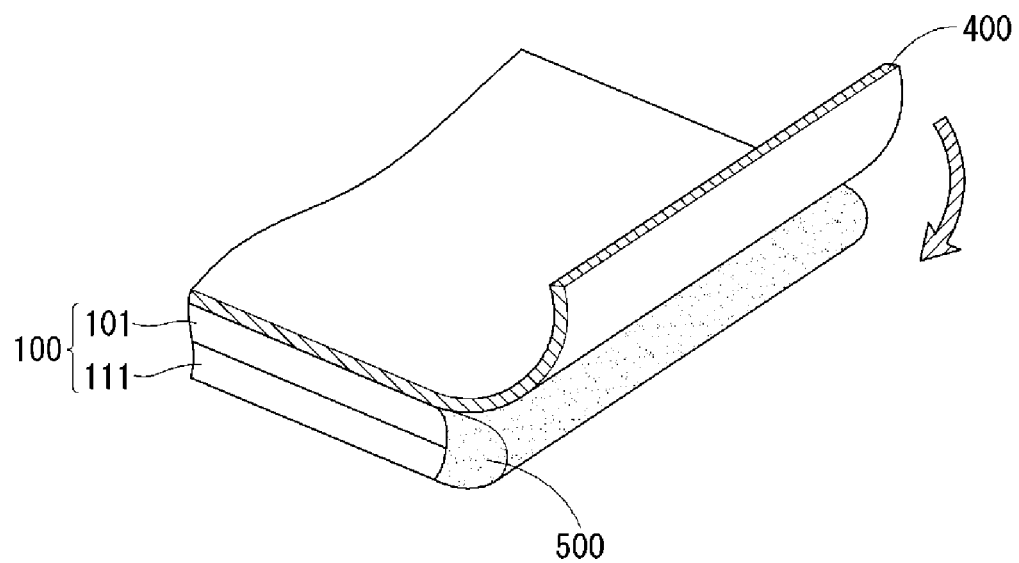

As shown in FIG. 16, in the formation process of the resin layer 500, the resin layer 500 may be formed on the side of the display panel 100 in a state where the film part 400 is attached to the front surface of the display panel 100. Afterwards, the film part 400 may be moved in a direction of the arrow as shown in FIG. 16 to cover the resin layer 500.

Figure 17:
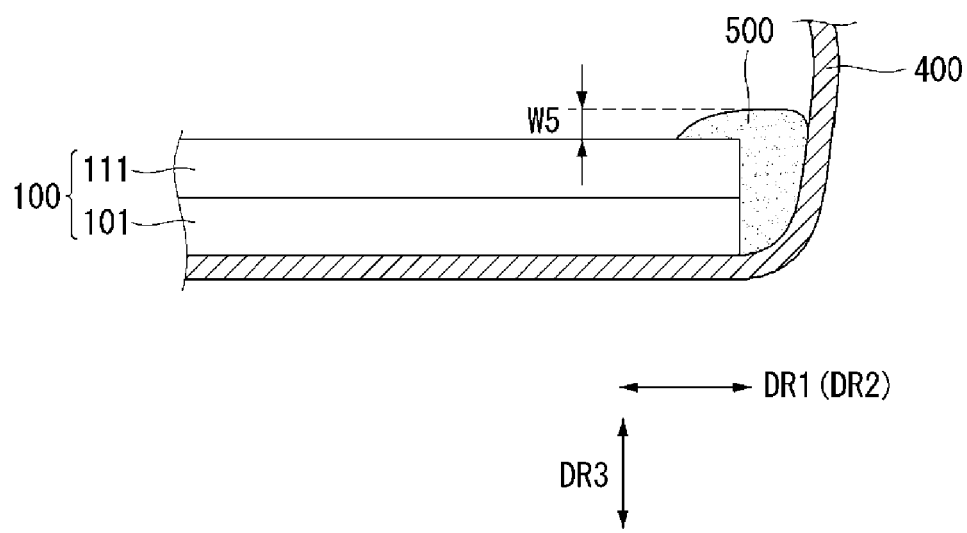

In this instance, a pressure may be applied to the resin layer 500 by the film part 400. As shown in FIG. 17, the resin layer 500 may include a portion that protrudes further than the back surface of the back substrate 111 by a predetermined distance W5 in the vertical direction (e.g., the third direction DR3) due to the pressure applied to the resin layer 500.

Figure 18:
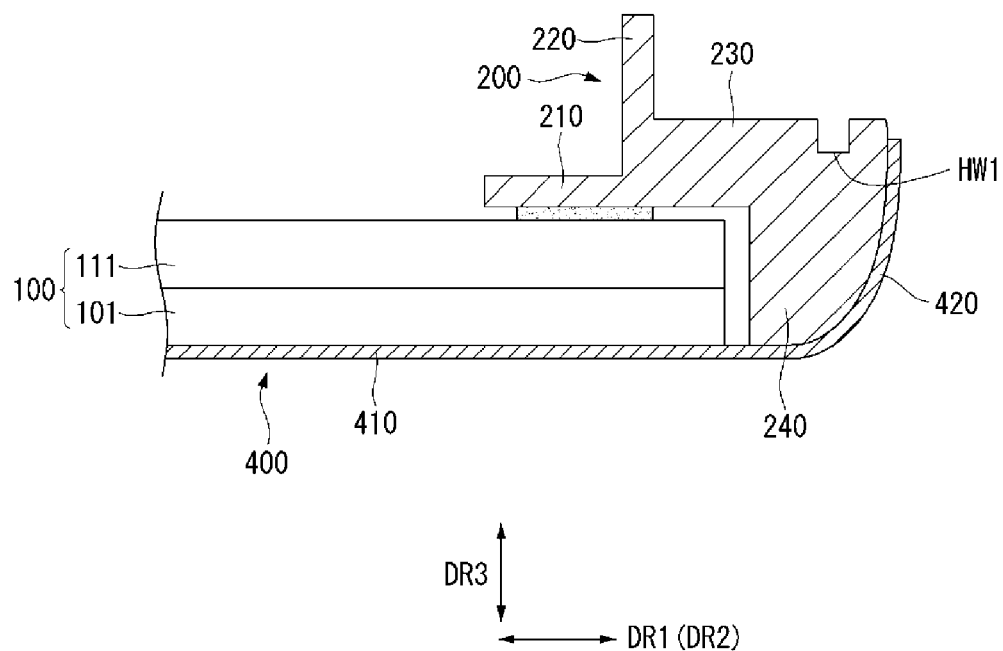

Referring to FIG. 18, the shape of the guide panel 200 may be variously changed. For example, the guide panel 200 may include a horizontal part 210, a vertical part 220, an auxiliary horizontal part 230 extending from the vertical part 220 in the horizontal direction (e.g., the first direction DR1 and/or the second direction DR2), and an auxiliary vertical part 240 extending from the auxiliary horizontal part 230 in the vertical direction (e.g., the third direction DR3).

In the embodiment disclosed herein, the auxiliary horizontal part 230 may extend in the opposite direction to the horizontal part 210, and the auxiliary vertical part 240 may extend in the opposite direction to the vertical part 220.

In other words, the horizontal part 210 may extend toward the middle of the display panel 100, and the auxiliary horizontal part 230 may extend in a direction away from the middle of the display panel 100. Further, the vertical part 220 may extend toward the rear of the display panel 100, and the auxiliary vertical part 240 may extend toward the front of the display panel 100.

The auxiliary horizontal part 230 may include a portion that extends further than the display panel 100 in the horizontal direction (e.g., the first direction DR1 and/or the second direction DR2).

The auxiliary vertical part 240 may include a portion that covers the side of the display panel 100. Namely, the guide panel 200 may include a portion covering the side of the display panel 100.

The guide panel 200 may include a groove HW1. For example, the auxiliary horizontal part 230 of the guide panel 200 may include the groove HW1. The groove HW1 may be a hole.

Figure 19:
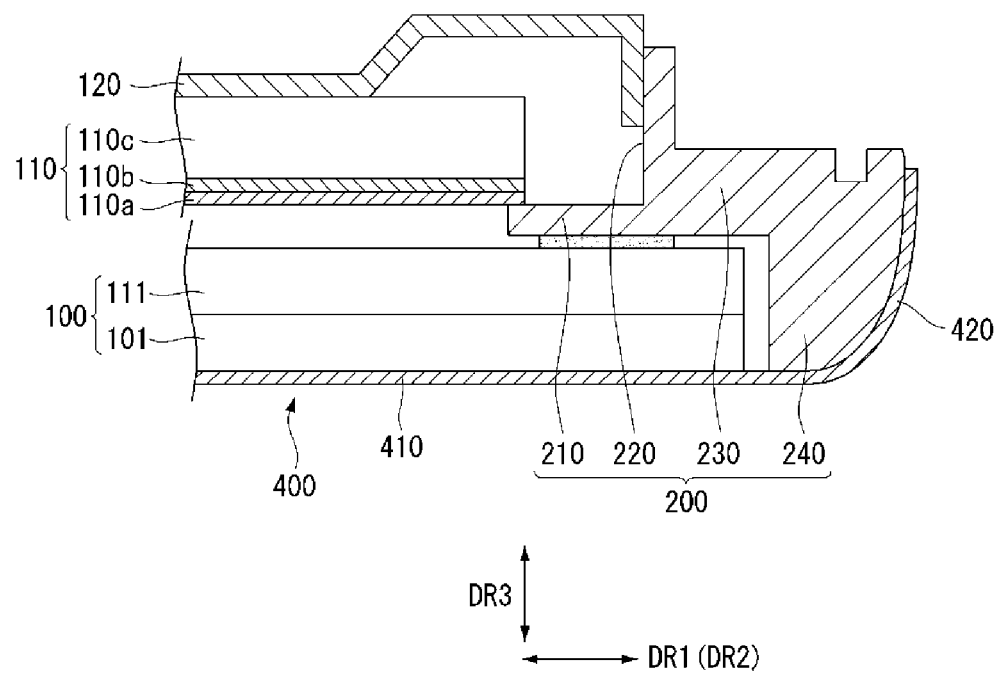

As shown in FIG. 19, the optical layer 110 included in a backlight unit may be disposed between the back cover 130 and the display panel 100. The optical layer 110 may include a plurality of sheets. For example, the optical layer 110 may include a light guide plate 110c, a prism sheet 110b, and a diffusion sheet 110a.

The optical layer 110 may be disposed on the horizontal part 210 of the guide panel 200. Hence, an air gap may be formed between the optical layer 110 and the display panel 100.

The frame 120 may be disposed in the rear of the optical layer 110. Further, although not shown, the light source unit including at least one light source may be disposed on the frame 120. The light source unit may be included in the backlight unit.

The light source unit may include various kinds of light sources in the embodiment of the disclosure. For example, the light source may be one of a light emitting diode (LED) chip and a LED package having at least one LED chip. In this instance, the light source may be a colored LED emitting at least one of red, green, and blue light or a white LED.

The backlight unit applicable to the embodiment of the disclosure may be one of a direct type backlight unit and an edge type backlight unit. As shown in FIG. 19, when the optical layer 110 includes the light guide plate 110c, the edge type backlight unit may be applied. When the light guide plate 110c is omitted in the optical layer 110, the direct type backlight unit may be applied.

Figure 20:
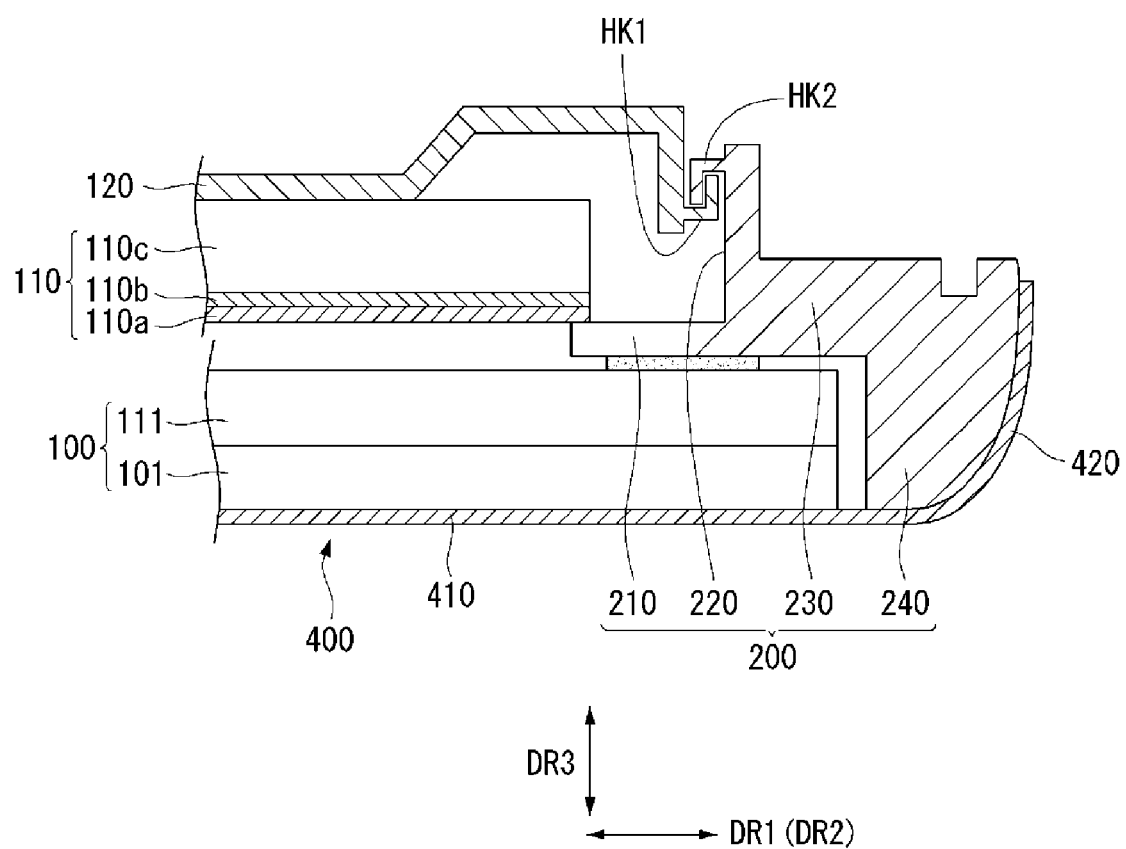

The frame 120 may be positioned adjacent to the guide panel 200. For example, the frame 120 may be connected to the vertical part 220 of the guide panel 200. As shown in FIG. 20, the frame 120 may include a first hook HK1, and the guide panel 200 may include a second hook HK2 corresponding to the first hook HK1 for the connection between the frame 120 and the guide panel 200.

As the first hook HK1 is engaged with the second hook HK2, the frame 120 may be connected to the guide panel 200. As described above, the guide panel 200 may be connected to at least one end of the frame 120.

Figure 21:
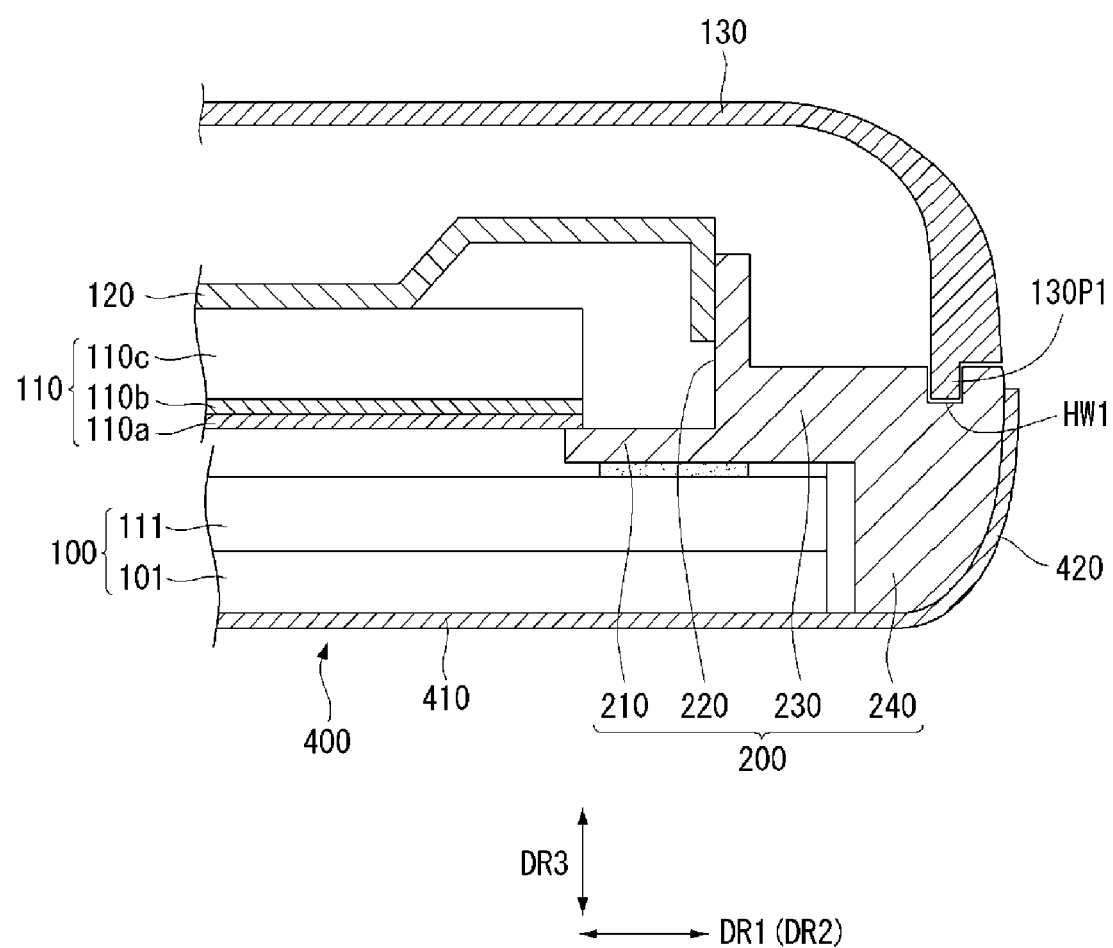

As shown in FIG. 21, an end of the back cover 130 may correspond to the guide panel 200. For example, the back cover 130 may include a first protrusion 130P1 at its end, and the first protrusion 130P1 of the back cover 130 may be inserted into the groove HW1 of the guide panel 200. Hence, the back cover 130 may correspond to the guide panel 200.

Figure 22:
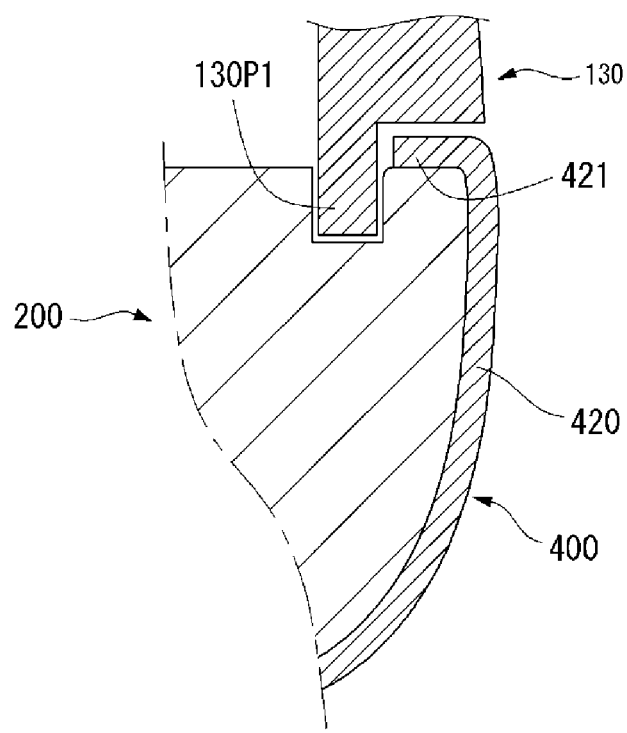

As shown in FIG. 22, an end of the second part 420 of the film part 400 may include a portion 421 positioned between the back cover 130 and the guide panel 200. In this instance, the guide panel 200 may be completely covered with the film part 400 and/or the back cover 130. Hence, an appearance of the display device 10 may be enhanced.

Figure 23:
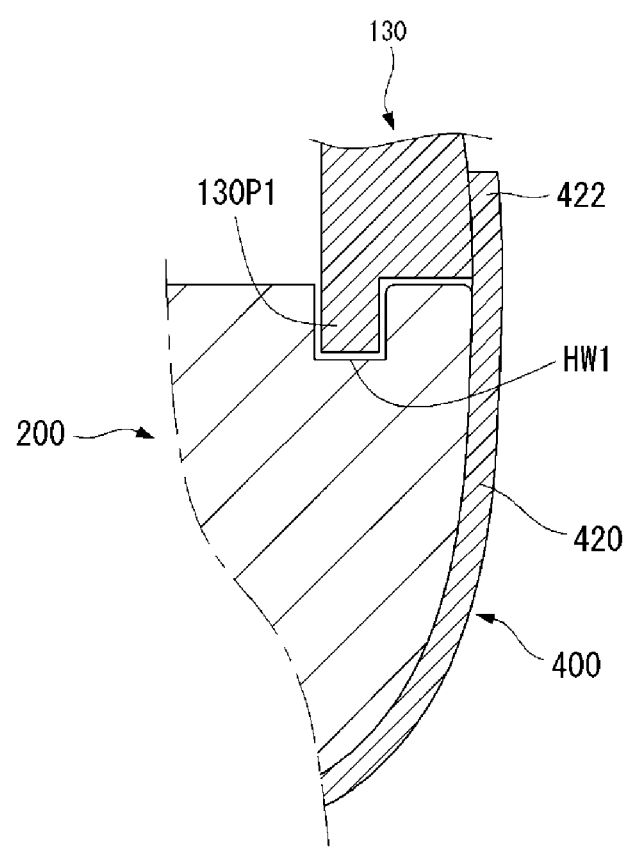

Alternatively, as shown in FIG. 23, the second part 420 of the film part 400 may include a portion 422 attached to a portion of the back cover 130. In this instance, the film part 400 may cover a boundary between the guide panel 200 and the back cover 130. Thus, the guide panel 200 may be completely covered with the film part 400 and/or the back cover 130.

Figure 24:
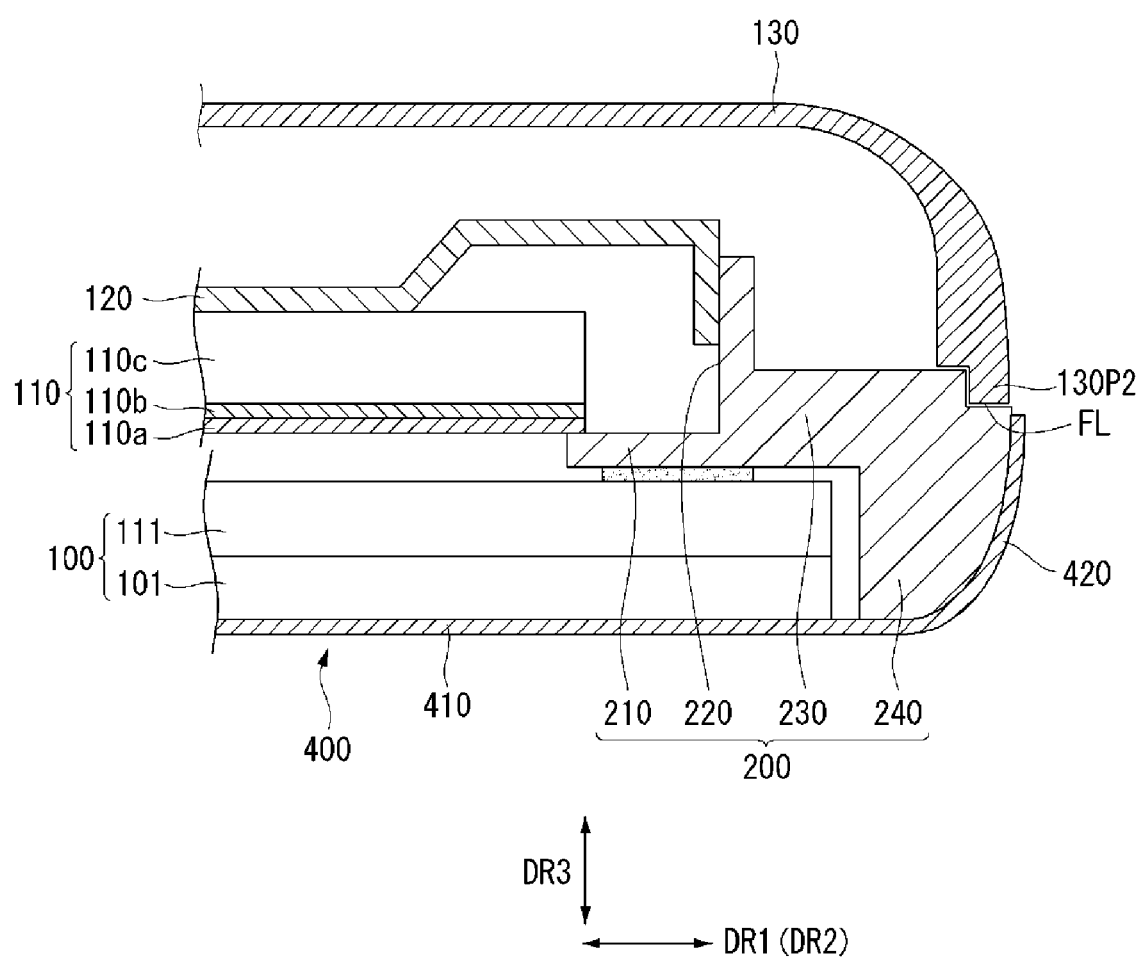

As shown in FIG. 24, the auxiliary horizontal part 230 of the guide panel 200 may include a flange FL at its end. The flange FL may be formed by depressing a portion (or recessed portion) of the end of the auxiliary horizontal part 230 in the vertical direction (e.g., the third direction DR3).

A second protrusion 130P2 formed at an end of the back cover 130 may correspond to the flange FL of the guide panel 200. In this instance, the end of the back cover 130 may cover a portion of the guide panel 200.

Figure 25:
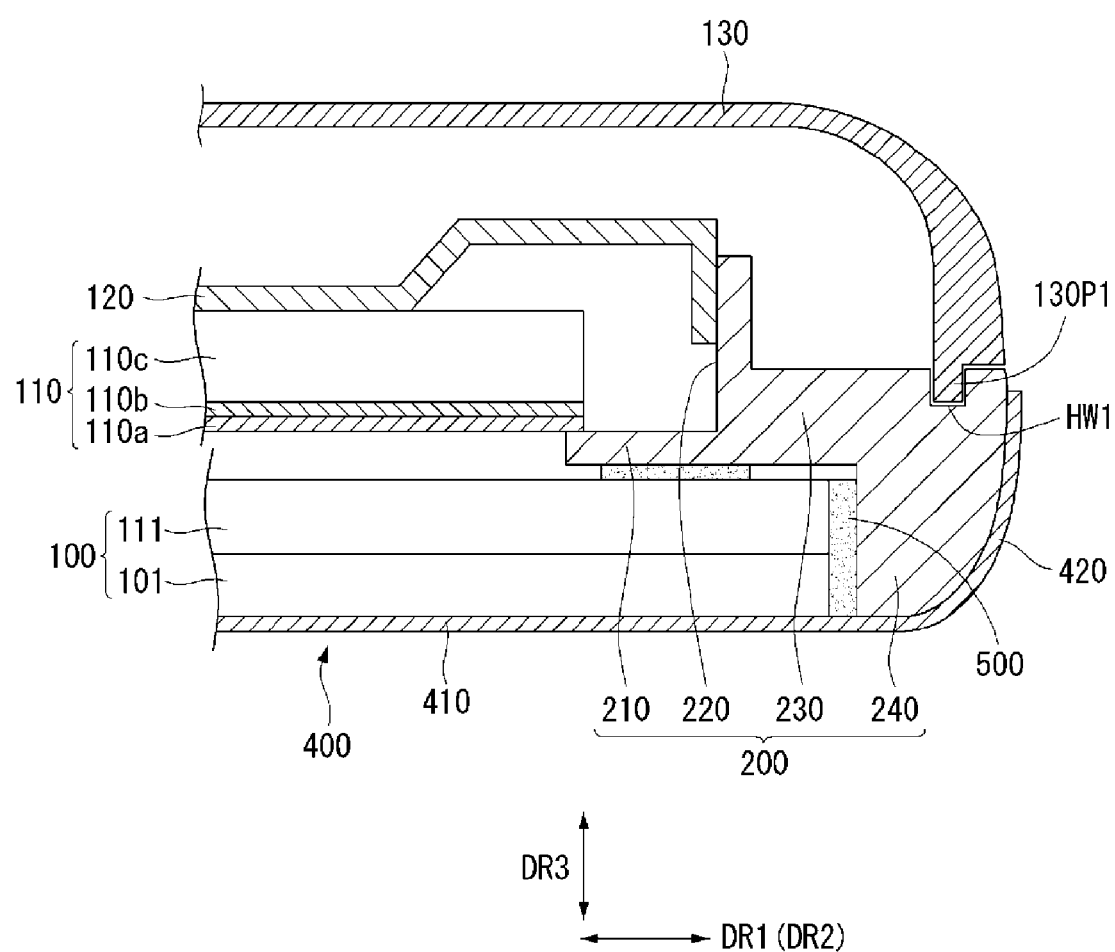

As shown in FIG. 25, the resin layer 500 may be formed between the display panel 100 and the auxiliary vertical part 240 of the guide panel 200. Even in such a configuration, the resin layer 500 may commonly contact the display panel 100, the guide panel 200, and the film part 400.

Figure 26:
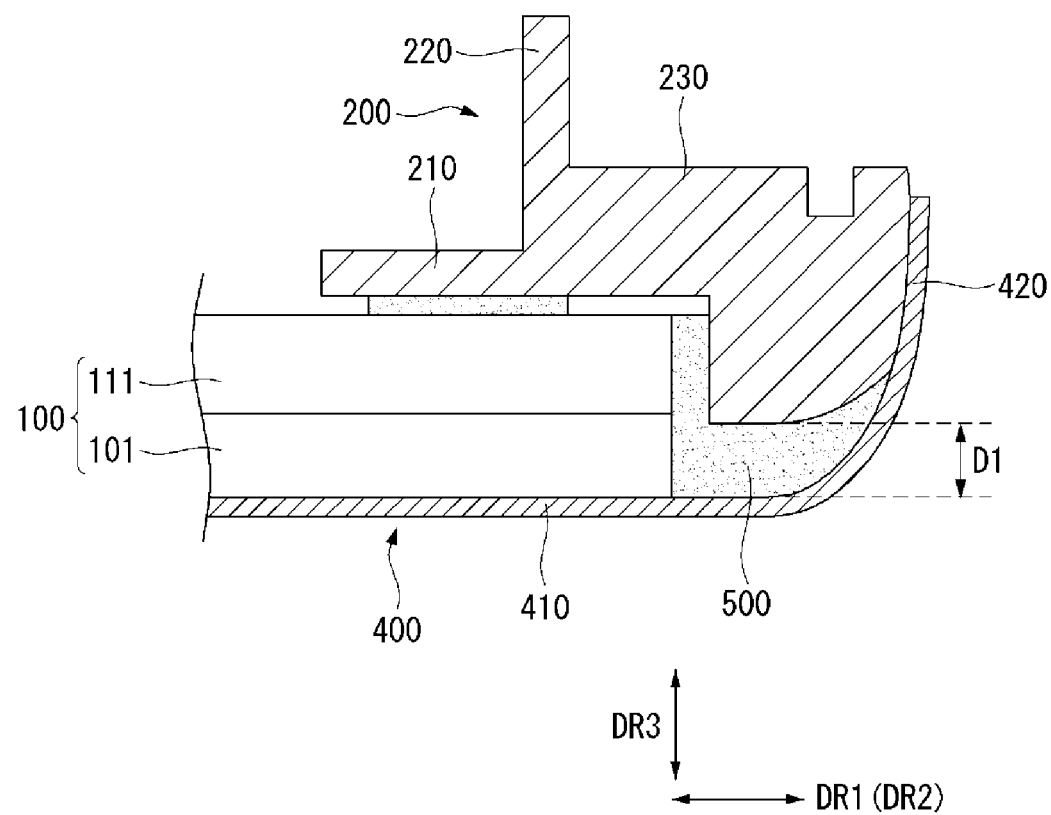

As shown in FIG. 26, the display panel 100 may protrude further than the guide panel 200 by a predetermined height D1 in the vertical direction (e.g., the third direction DR3). In this instance, the resin layer 500 may compensate for a height difference between the display panel 100 and the guide panel 200. Hence, the resin layer 500 may prevent the film part 400 from sharply bending and may improve the appearance of the display device 10.

Figure 27:
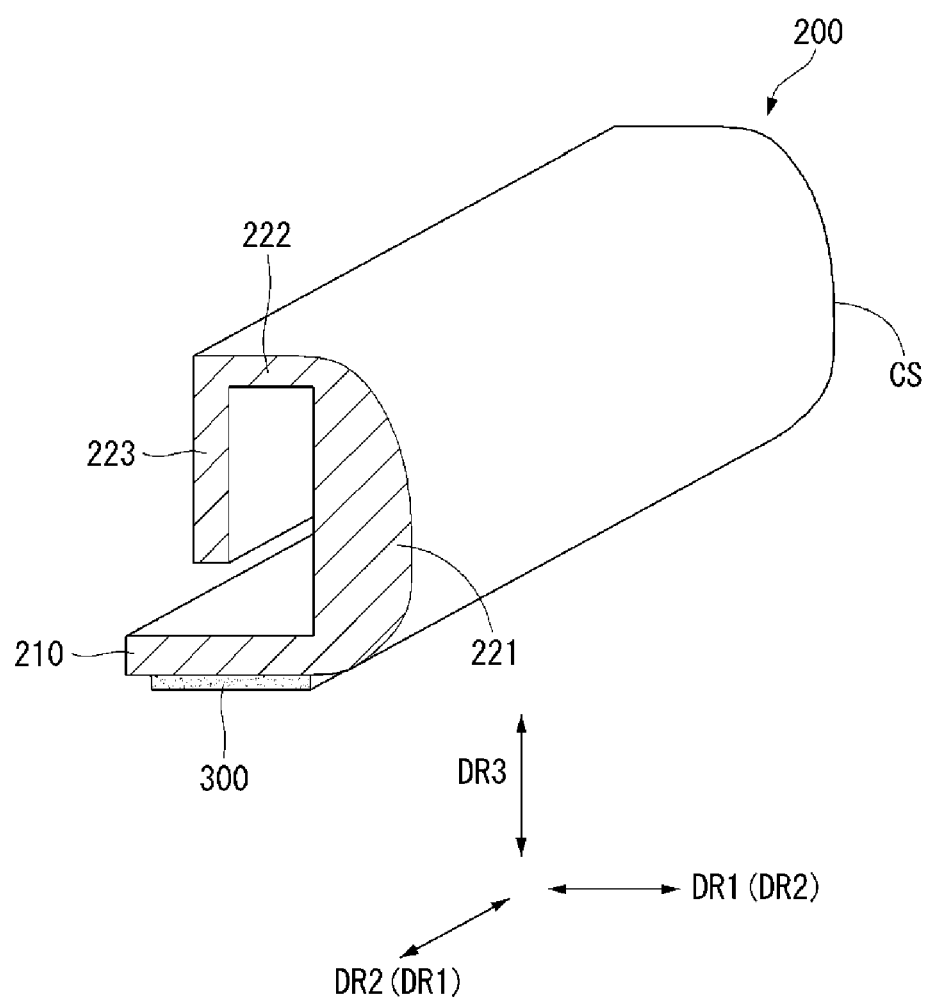
Figure 28:
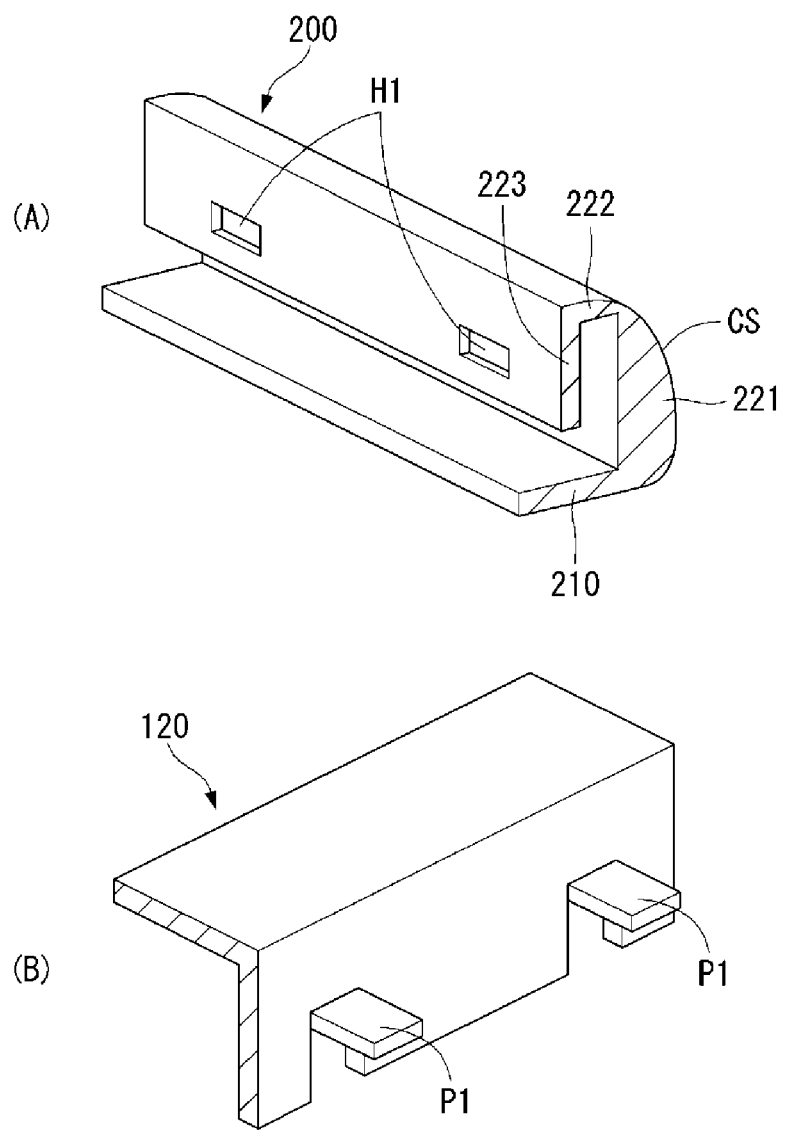

In the embodiment of the disclosure, the configuration of the guide panel 200 is not limited to the configuration described above. For example, as shown in FIG. 27, the vertical part 220 of the guide panel 200 may include a first vertical portion 221 that extends from the horizontal part 210 in the vertical direction (e.g., the third direction DR3), a second vertical portion 222 that extends from the first vertical portion 221 in the horizontal direction (e.g., the first direction DR1 and/or the second direction DR2) (toward the middle of the display panel 100), and a third vertical portion 223 that extends from the second vertical portion 222 in the vertical direction (e.g., the third direction DR3) (toward the horizontal part 210).

Figure 29:
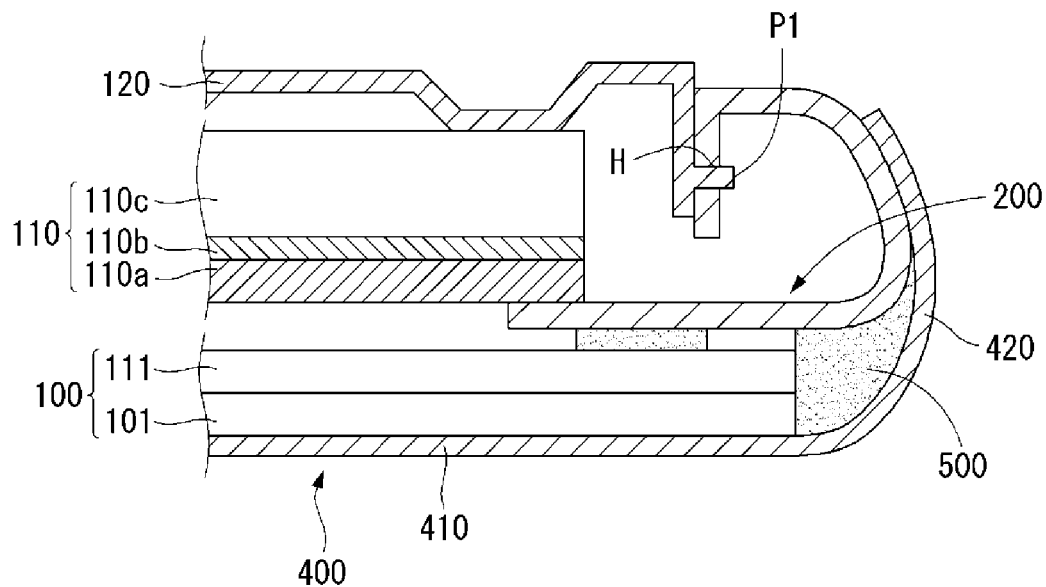

In the embodiment disclosed herein, the first vertical portion 221 may include a curved surface CS. As shown in (A) of FIG. 28, the third vertical portion 223 of the guide panel 200 may include a first opening H1. As shown in (B) of FIG. 28, the frame 120 may include a protrusion P1 corresponding to the first opening H1. As shown in FIG. 29, as the protrusion P1 of the frame 120 is inserted into the first opening H1 of the guide panel 200, the frame 120 may be connected to the guide panel 200.

Figure 30:
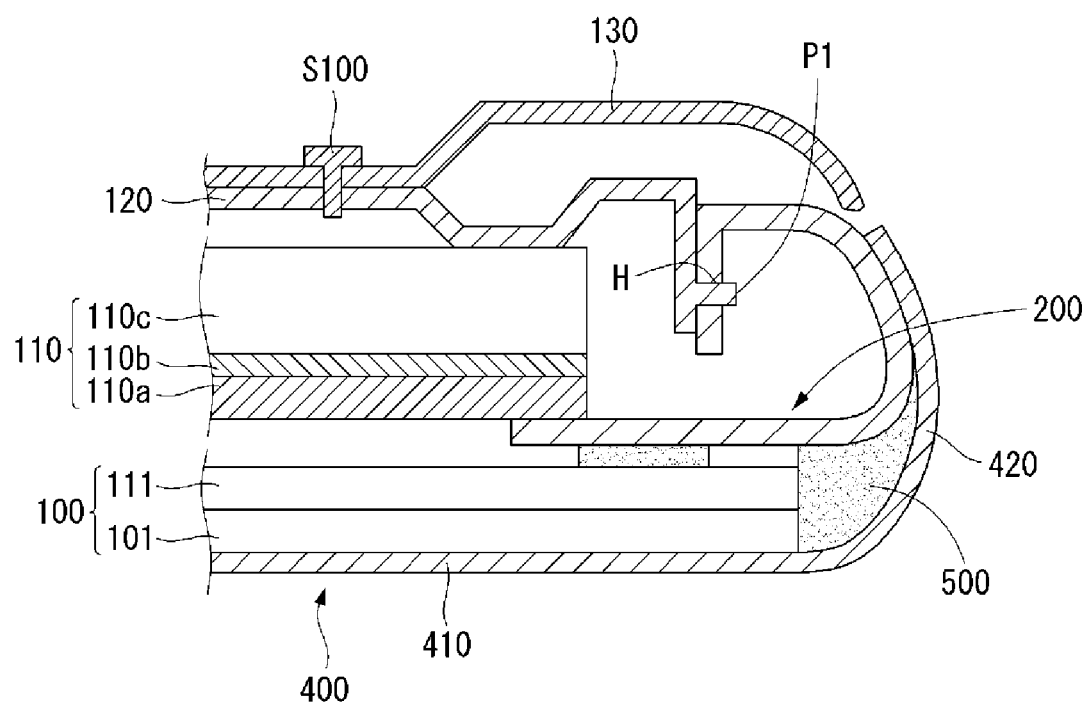

As shown in FIG. 30, a first fastening member S100 may fasten the back cover 130 to the frame 120. Even when the configuration of the guide panel 200 is changed as described above, the second part 420 of the film part 400 may be attached to the curved surface CS of the guide panel 200.

Figure 31:
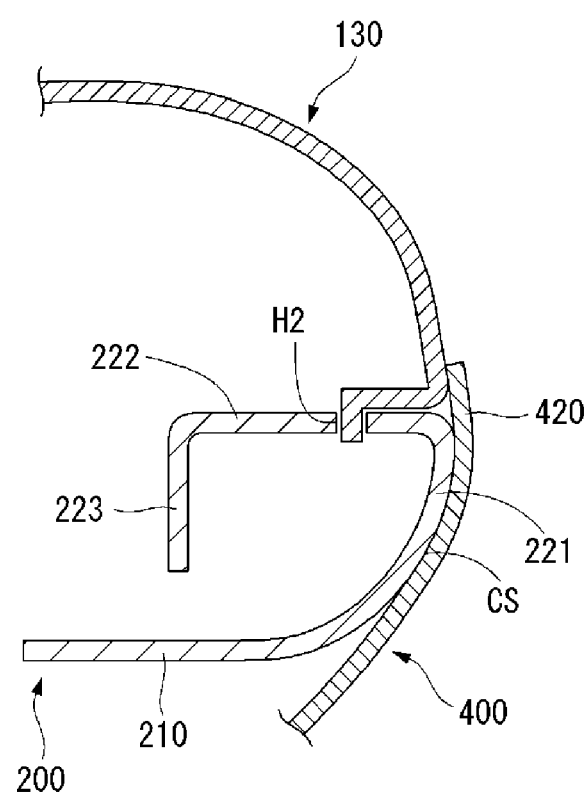

As shown in FIG. 31, the second vertical portion 222 of the guide panel 200 may have a second hole H2, and the end of the back cover 130 may be inserted into the second hole H2 of the guide panel 200. In this instance, the second part 420 of the film part 400 may be attached to a portion of the back cover 130.

FIGS. 32 to 56 illustrate another configuration of a display device according to the embodiment of the disclosure. In the following description, the descriptions of the configuration and the structure described above may be omitted.

Figure 32:
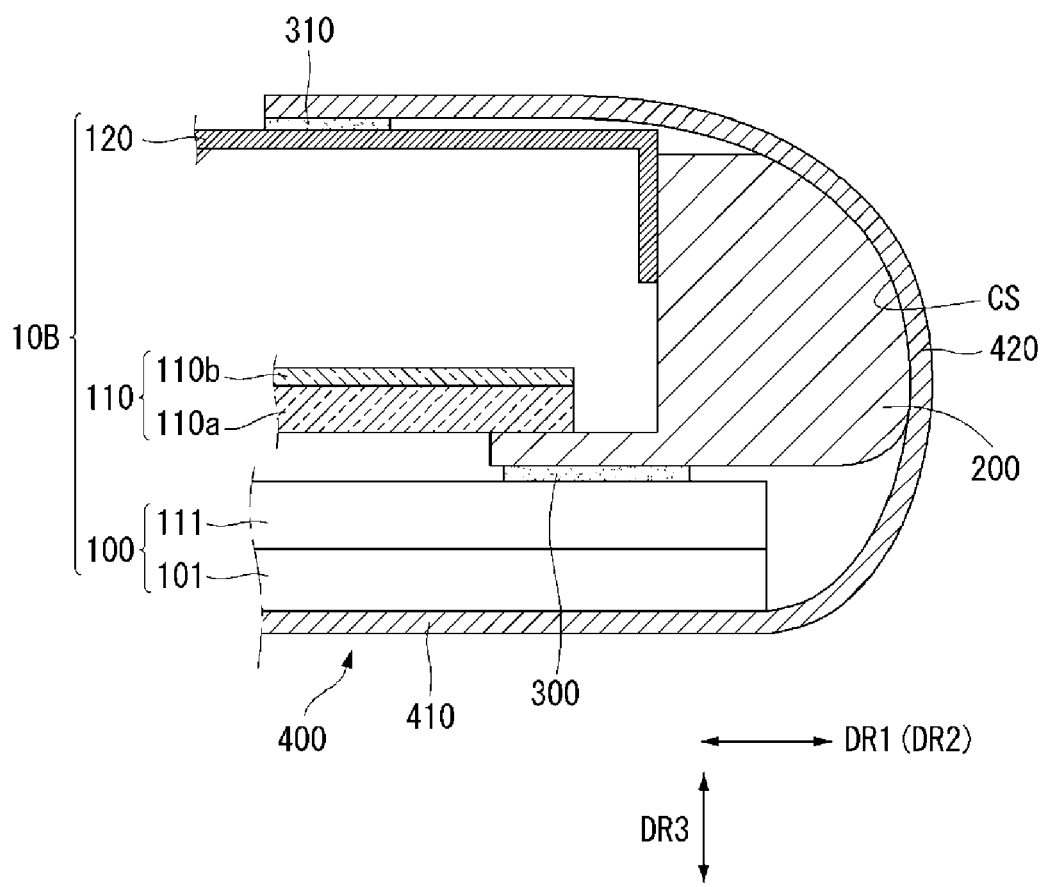
FIGS. 32 to 56 illustrate another configuration of a display device according to an exemplary embodiment of the disclosure.

As shown in FIG. 32, a film part 400 may cover an external surface of a guide panel 200. For example, a second part 420 of the film part 400 may cover a curved surface CS of the guide panel 200.

In the embodiment disclosed herein, the film part 400 is not attached to the guide panel 200 and may simply cover the guide panel 200. Further, the film part 400 may extend to a frame 120 and may be connected to the frame 120.

The film part 400 may be attached to the frame 120. For this, another adhesive layer 310, for example, a second adhesive layer 310 may be disposed between the film part 400 and the frame 120.

As described above, the film part 400 attached to a front surface of a display panel 100 may extend to the rear of a display module 10B and may be attached to the frame 120. In such a configuration, the film part 400 may cover a front surface of the display module 10B and also may cover at least a portion of the side of the display module 10B.

Further, the second part 420 of the film part 400 may cover a portion of the rear of the display module 10B. Namely, the film part 400 may cover the display module 10B as described above.

In the embodiment disclosed herein, the second part 420 of the film part 400 may include a black part. Since, the black part was described in detail with reference to FIGS. 4 to 6, a further description thereof may be omitted.

Figure 33:
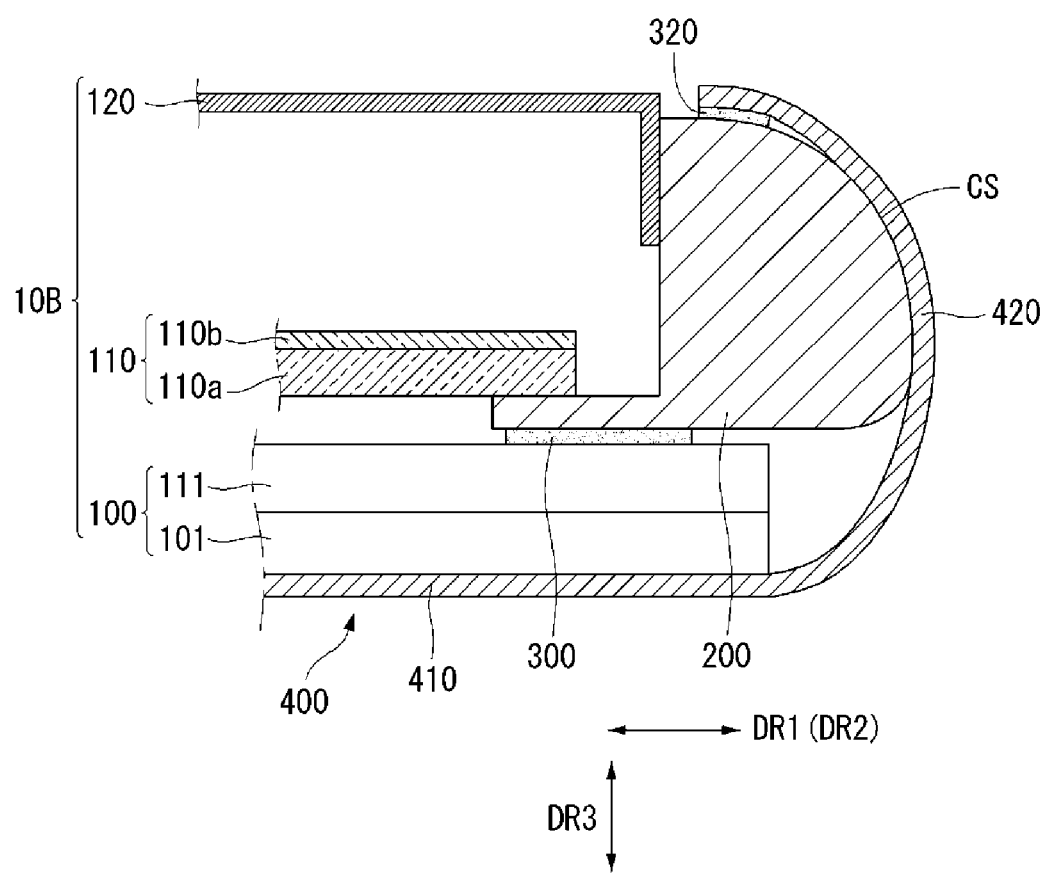

Alternatively, as shown in FIG. 33, the film part 400 may be attached to a portion of the guide panel 200. A third adhesive layer 320 may be disposed between the film part 400 and the guide panel 200.

Figure 34:
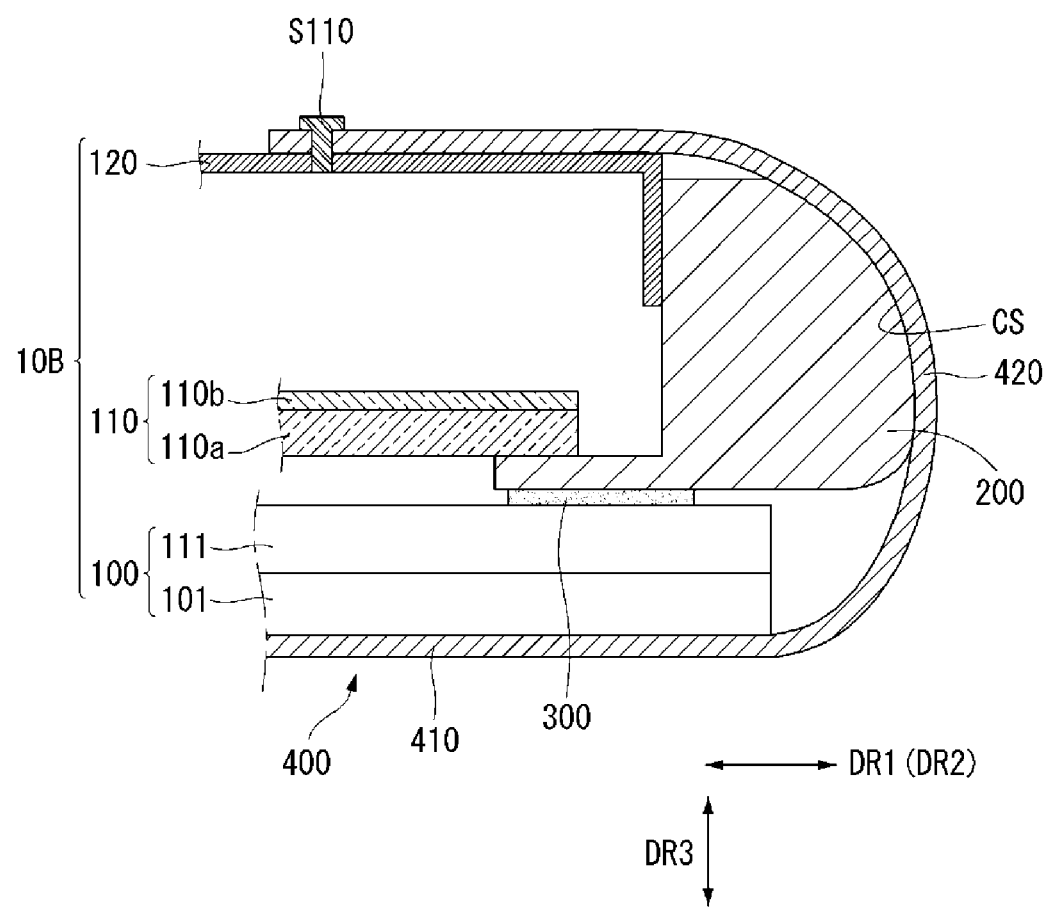

In this instance, the lamination method may be not used to attach the film part 400 to the guide panel 200. As shown in FIG. 34, the film part 400 may be connected to the frame 120 through a second fastening member S110 such as a screw. As described above, the method for connecting the film part 400 to the frame 120 may be variously changed.

Figure 35:
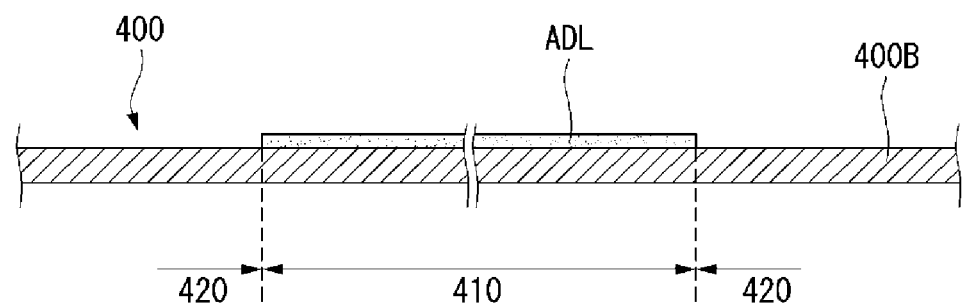

It may be preferable, but not required, that the second part 420 of the film part 400 is not attached to the guide panel 200 for the convenience of manufacturing process. For this, as shown in FIG. 35, an adhesive layer ADL may be formed in an area corresponding to a first part 410 of the film part 400, but may be omitted in an area corresponding to the second part 420 of the film part 400.

In this instance, because the film part 400 is not attached to the guide panel 200 in the manufacturing process, a process for connecting the film part 400 to the frame 120 may more easily be performed. Further, when it is difficult to use a curved lamination method, the guide panel 200 may be covered with the film part 400.

Figure 36:
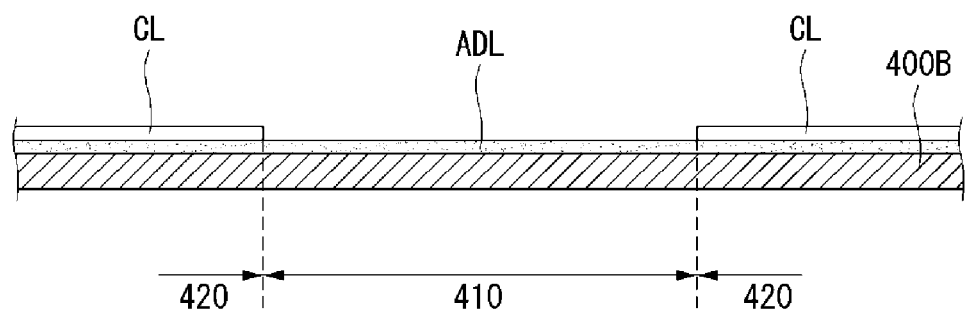

Alternatively, as shown in FIG. 36, the film part 400 may include a film layer 400B, the adhesive layer ADL formed on the film layer 400B, and a cover layer CL. The cover layer CL may cover the adhesive layer ADL in the area corresponding to the second part 420 of the film part 400. Further, the cover layer CL may be omitted in the area corresponding to the first part 410 of the film part 400.

Figure 37:
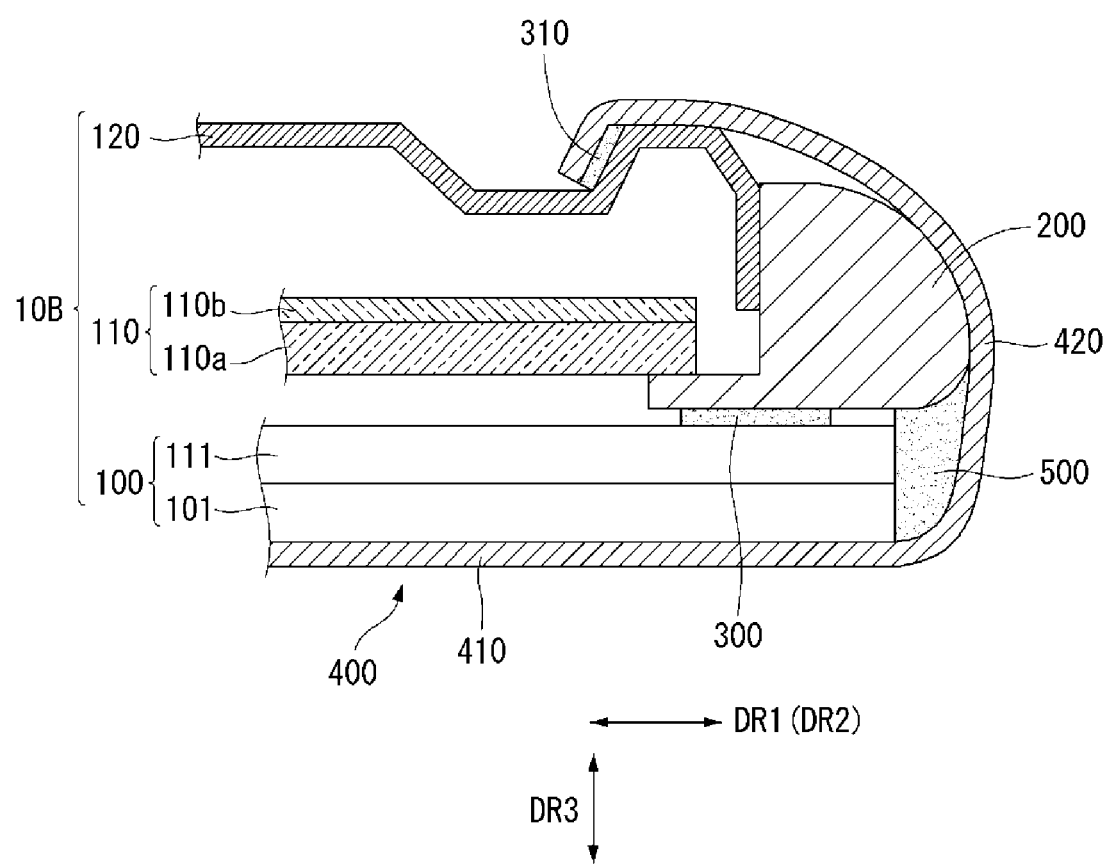

The cover layer CL may be configured so that the second part 420 of the film part 400 is not attached to the guide panel 200. As shown in FIG. 37, even when the film part 400 is not attached to the guide panel 200, a resin layer 500 may be formed on the side of the display panel 100.

Figure 38:
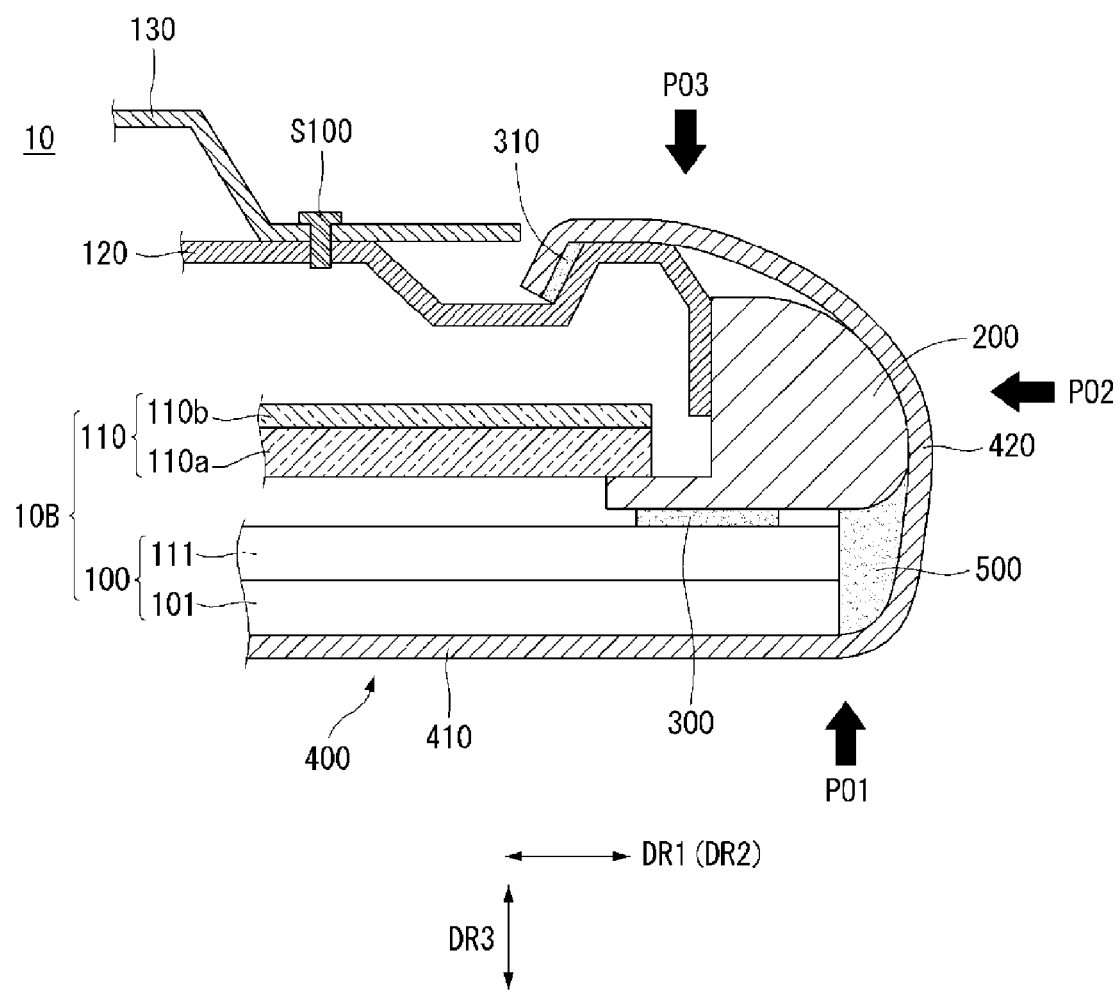

As shown in FIG. 38, a back cover 130 may be disposed in the rear of the frame 120. At least a portion of each of the first part 410 and the second part 420 of the film part 400 may be exposed in a state where the back cover 130 is connected to the frame 120. Preferably, the whole of the first part 410 may be exposed.

In this instance, an observer at a first position P01 may observe at least a portion (or the whole) of the first part 410 of the film part 400. Further, the observer at a second position P02 may observe at least a portion of the second part 420 of the film part 400. Hence, the observer may feel as if the display device 10 according to the embodiment of the disclosure is configured as one glass substrate. Alternatively, the observer at a third position P03 may observe at least a portion of the second part 420 of the film part 400.

Figure 39:
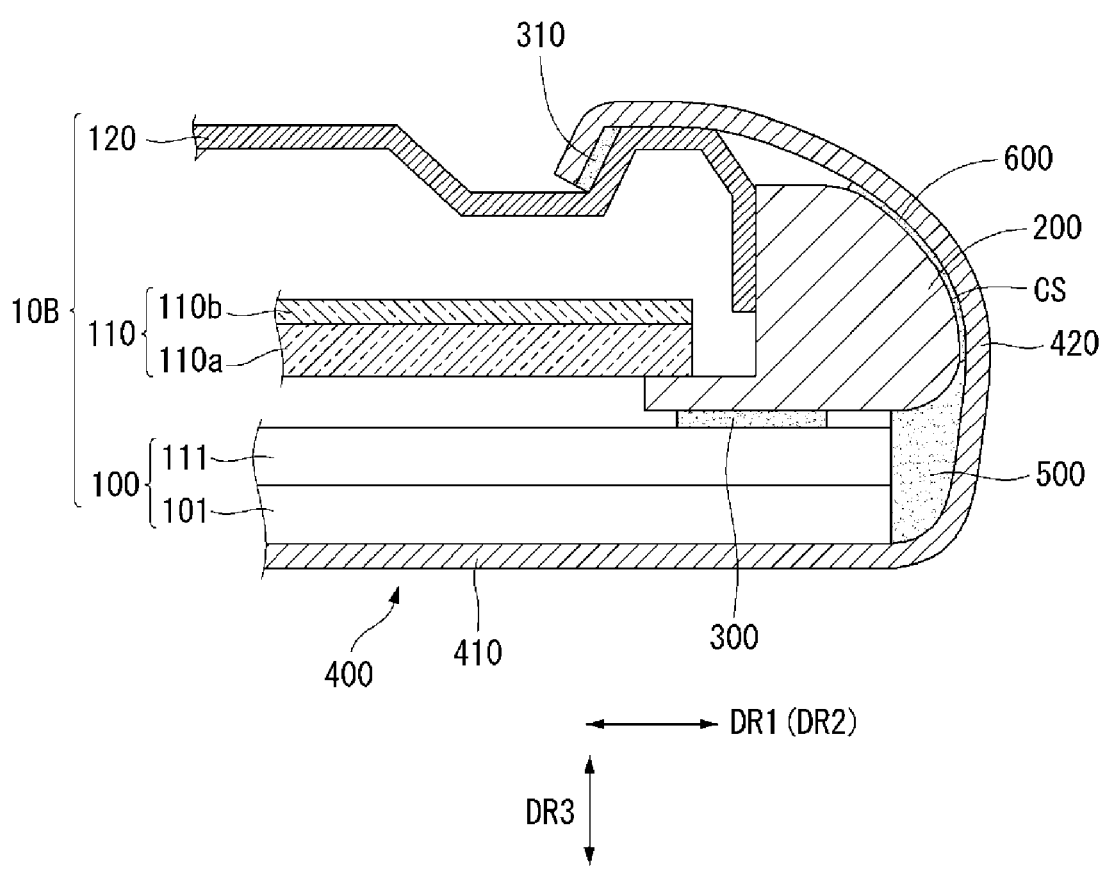

As shown in FIG. 39, a buffer 600 may be disposed between the film part 400 and the guide panel 200, so as to reduce a friction between the film part 400 and the guide panel 200. The buffer 600 may contain a material having the elasticity and the flexibility. For example, the buffer 600 may contain a sponge material. Alternatively, the buffer 600 may be a tape attached to the guide panel 200.

Figure 40:
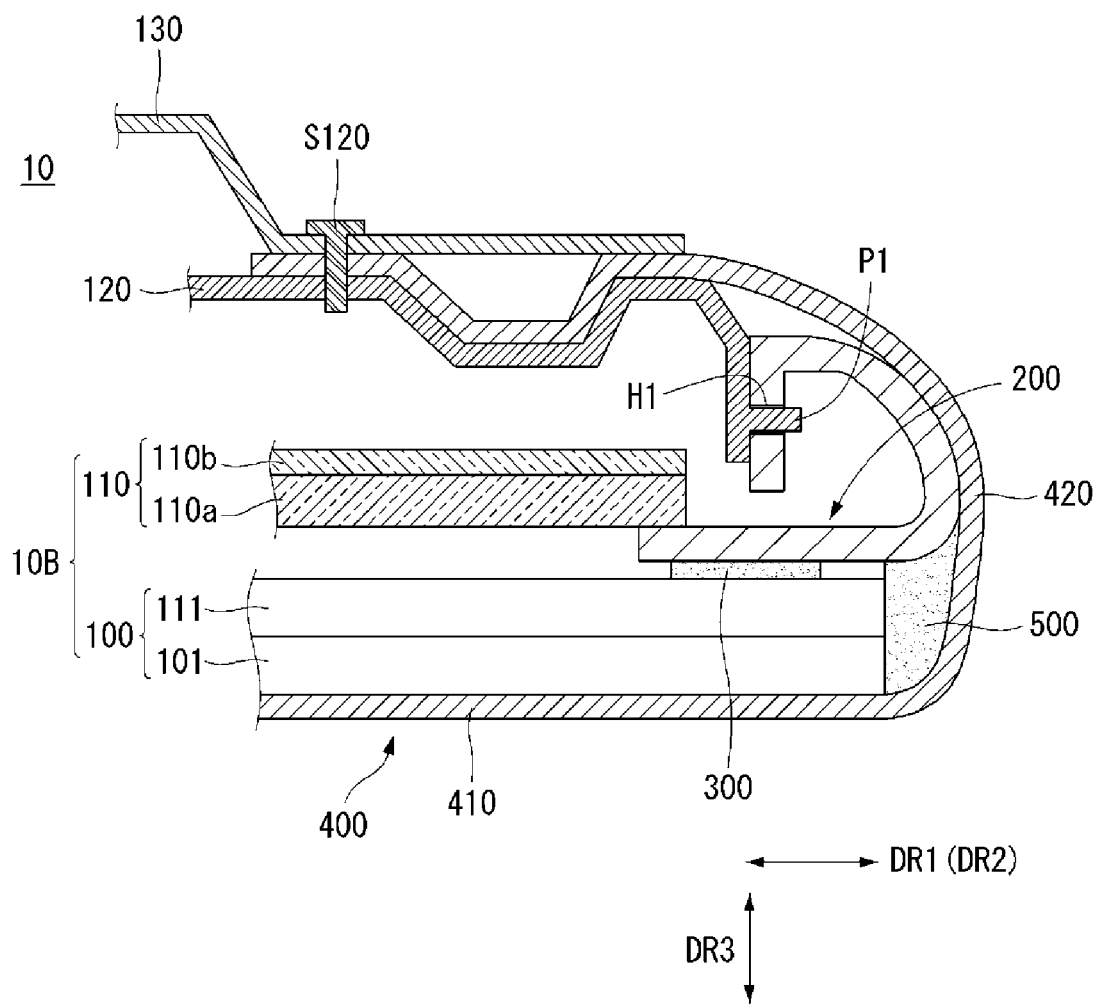

As shown in FIG. 40, the back cover 130 may cover a portion of the film part 400, for example, a portion of the second part 420 of the film part 400. In this instance, a third fastening member S120 such as a screw may fasten the back cover 130, the second part 420 of the film part 400, and the frame 120. Hence, the second part 420 of the film part 400 may be commonly connected to the frame 120 and the back cover 130.

Figure 41:
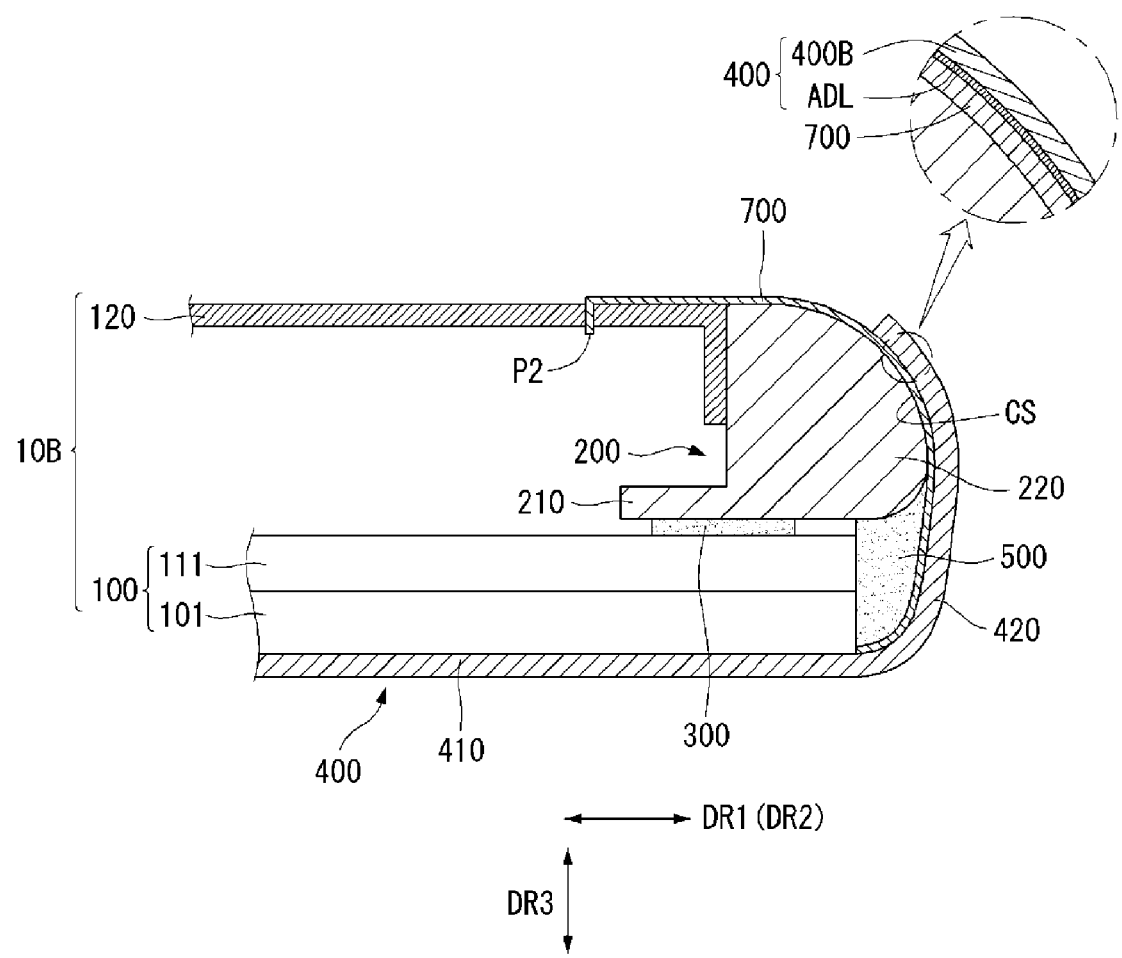

As shown in FIG. 41, an auxiliary cover 700 may be positioned between the second part 420 of the film part 400 and the display module 10B. The auxiliary cover 700 may cover at least a portion of the side of the display module 10B.

The second part 420 of the film part 400 may include a portion attached to the auxiliary cover 700. For this, the adhesive layer ADL may be formed between the auxiliary cover 700 and the film layer 400B.

Further, the auxiliary cover 700 may have a curved surface CS. The auxiliary cover 700 is not attached (e.g., using an adhesive) to the guide panel 200 and may simply cover the guide panel 200.

The auxiliary cover 700 may be connected to the frame 120. For this, the auxiliary cover 700 may include a protrusion P2, and the frame 120 may include a hole or a groove corresponding to the protrusion P2 of the auxiliary cover 700. The protrusion P2 of the auxiliary cover 700 may be inserted into the hole or the groove of the frame 120 and thus may be connected to the frame 120. As described above, when the auxiliary cover 700 is positioned between the guide panel 200 and the film part 400, the resin layer 500 may contact the auxiliary cover 700.

It may be preferable, but not required, that the auxiliary cover 700 has the flexibility capable of covering a curved surface CS of the guide panel 200 in a state where the auxiliary cover 700 is attached to the film part 400. For this, the auxiliary cover 700 may contain a metal material, for example, aluminum.

Figure 42:
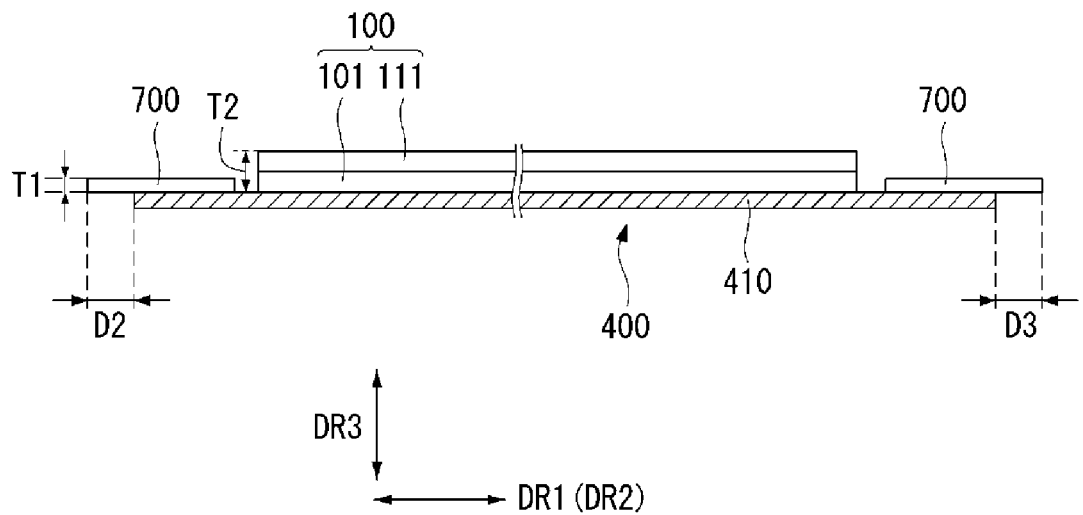

A method for forming the auxiliary cover 700 is described below. First, as shown in FIG. 42, after the display panel 100 and the auxiliary cover 700 are disposed in parallel with each other, the film part 400 may be attached to the display panel 100 and the auxiliary cover 700.

More specifically, the first part 410 of the film part 400 may be attached to the display panel 100, and the second part 420 of the film part 400 may be attached to the auxiliary cover 700. The auxiliary cover 700 may be configured as a metal plate capable of bending. Hence, a thickness T1 of the auxiliary cover 700 may be less than a thickness T2 of the display panel 100. The film part 400 may not be attached to partial areas D2 and D3 of the auxiliary cover 700 for the connection between the auxiliary cover 700 and the frame 120.

Figure 43:
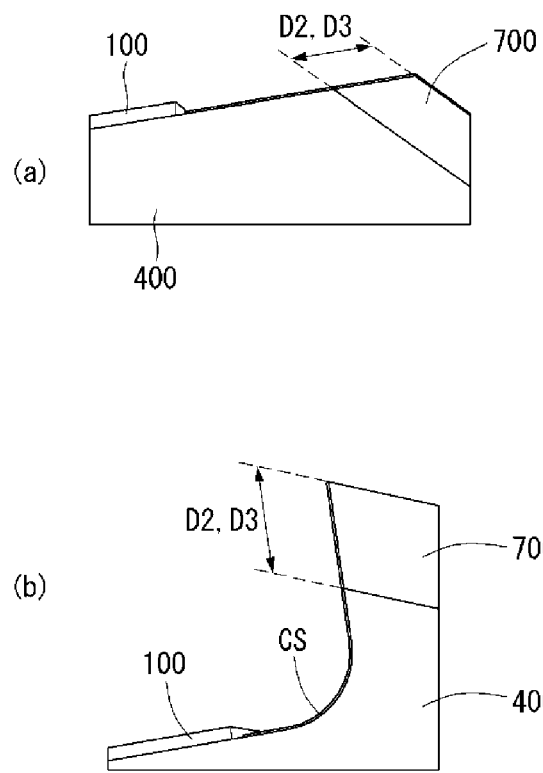

Next, as shown in (A) and (B) of FIG. 43, a curved surface CS of the auxiliary cover 700 may be formed by bending the auxiliary cover 700 in a state where the film part 400 is attached to the auxiliary cover 700. The curved surface CS of the auxiliary cover 700 may cover the guide panel 200.

Figure 44:
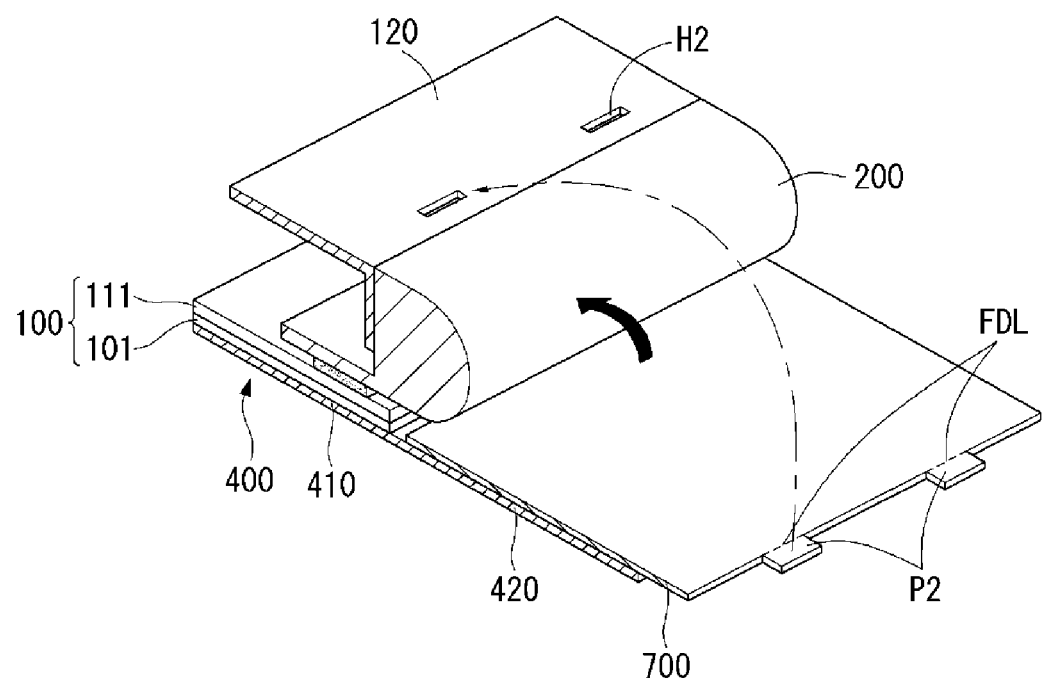

As shown in FIG. 44, the auxiliary cover 700 may include a protrusion P2 at its an end. The protrusion P2 of the auxiliary cover 700 may be inserted into a hole H2 of the frame 120 by folding the protrusion P2 along a fold line FDL shown in FIG. 44.

Figure 45:
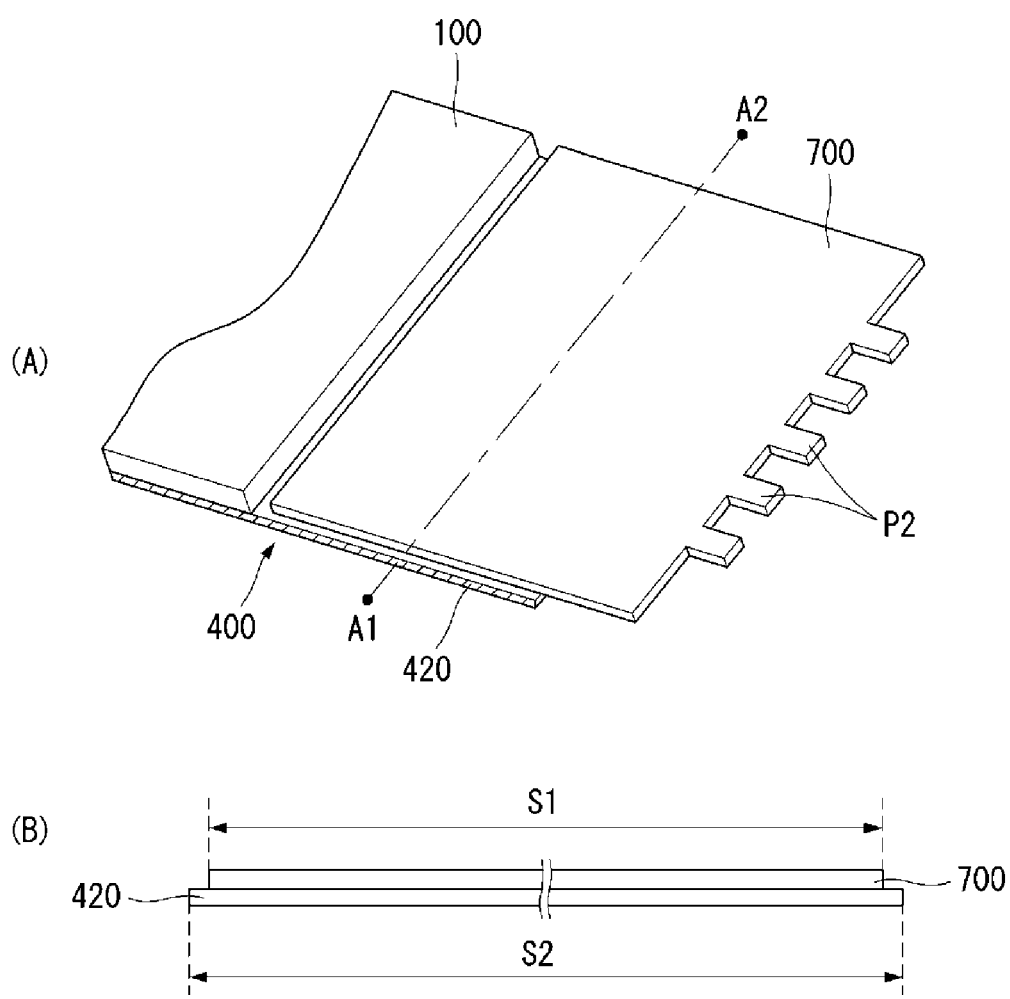

As shown in FIG. 45, a width S2 of the second part 420 of the film part 400 may be greater than a width S1 of the auxiliary cover 700. In this instance, the auxiliary cover 700 may be prevented from being exposed.

Figure 46:
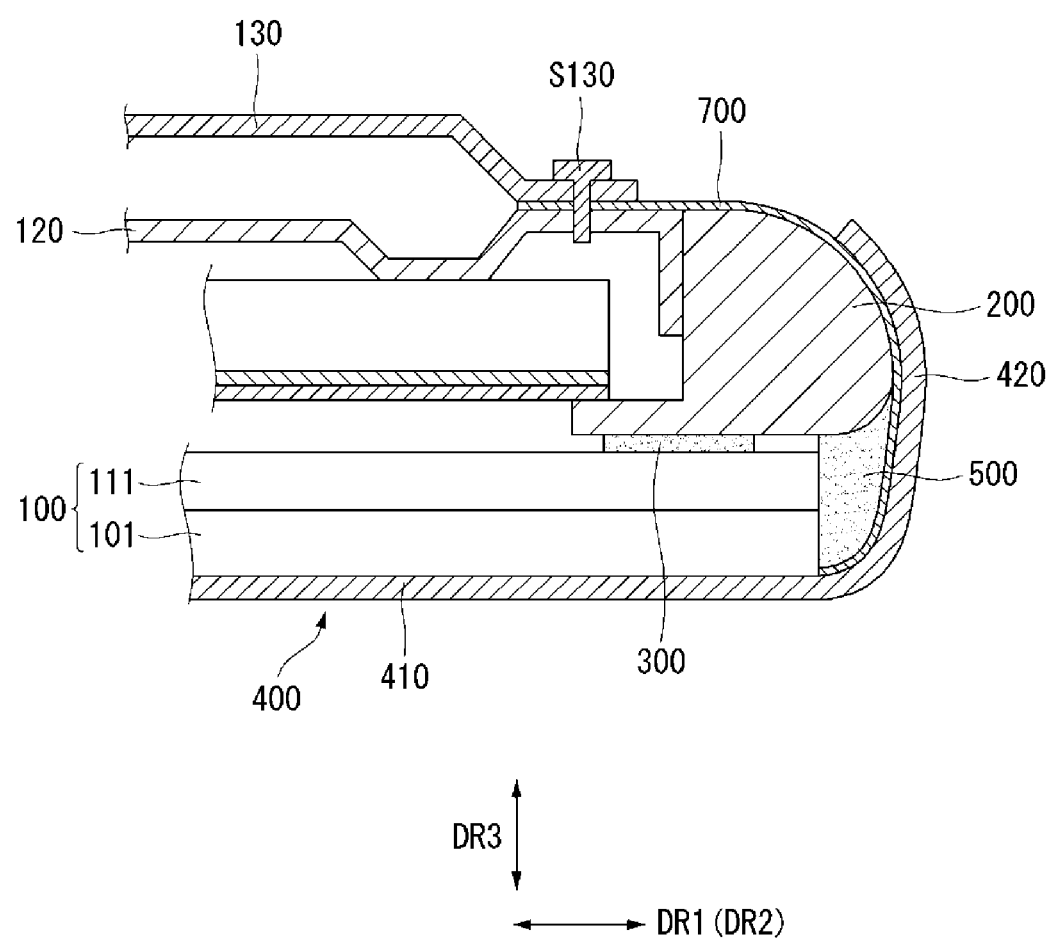

The auxiliary cover 700 may be connected to the frame 120 and/or the back cover 130. For example, as shown in FIG. 46, a fourth fastening member S130 such as a screw may commonly connect the back cover 130, the auxiliary cover 700, and the frame 120.

Figure 47:
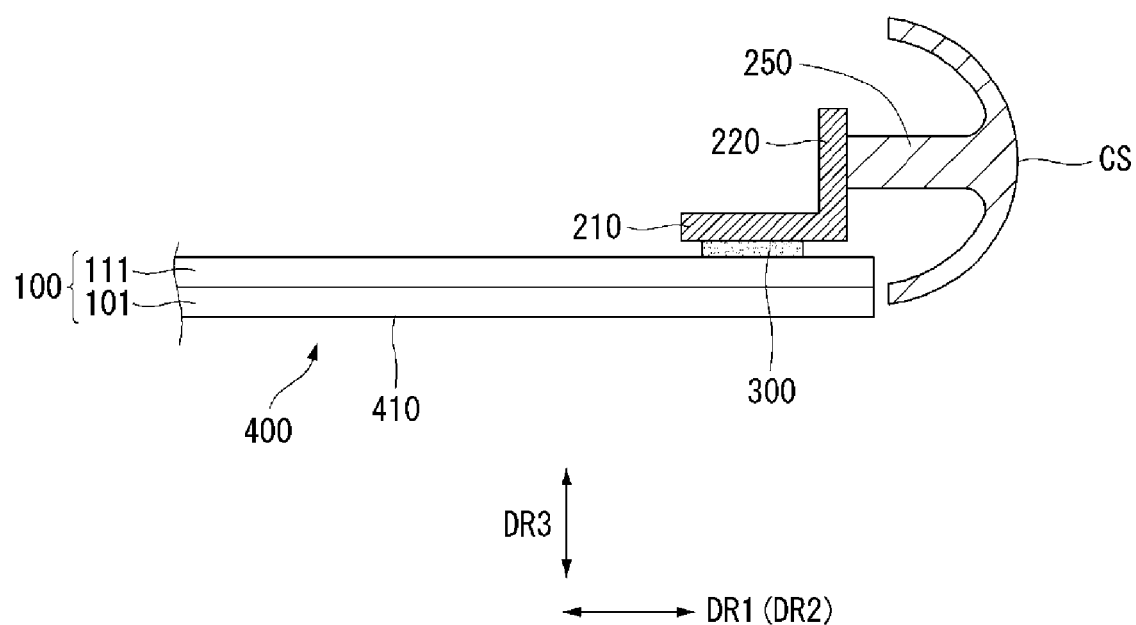

The structure of the guide panel 200 may be variously changed. For example, as shown in FIG. 47, the guide panel 200 may include a horizontal part 210, a vertical part 220, and a side part 250 which is connected to the vertical part 220 and has a curved surface CS.

Figure 48:
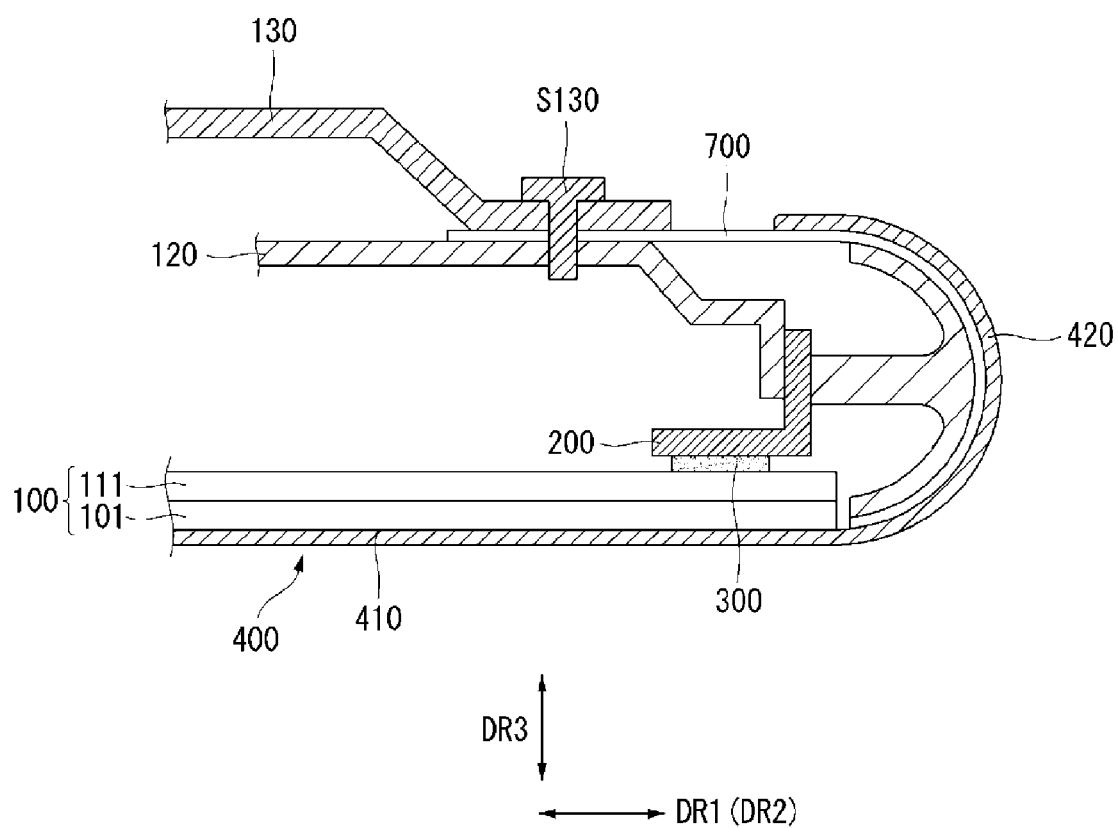

As shown in FIG. 48, even in such a configuration, the auxiliary cover 700 may be positioned between the second part 420 of the film part 400 and the guide panel 200. More specifically, the auxiliary cover 700 may be positioned between the second part 420 of the film part 400 and the side part 250 of the guide panel 200.

Figure 49:
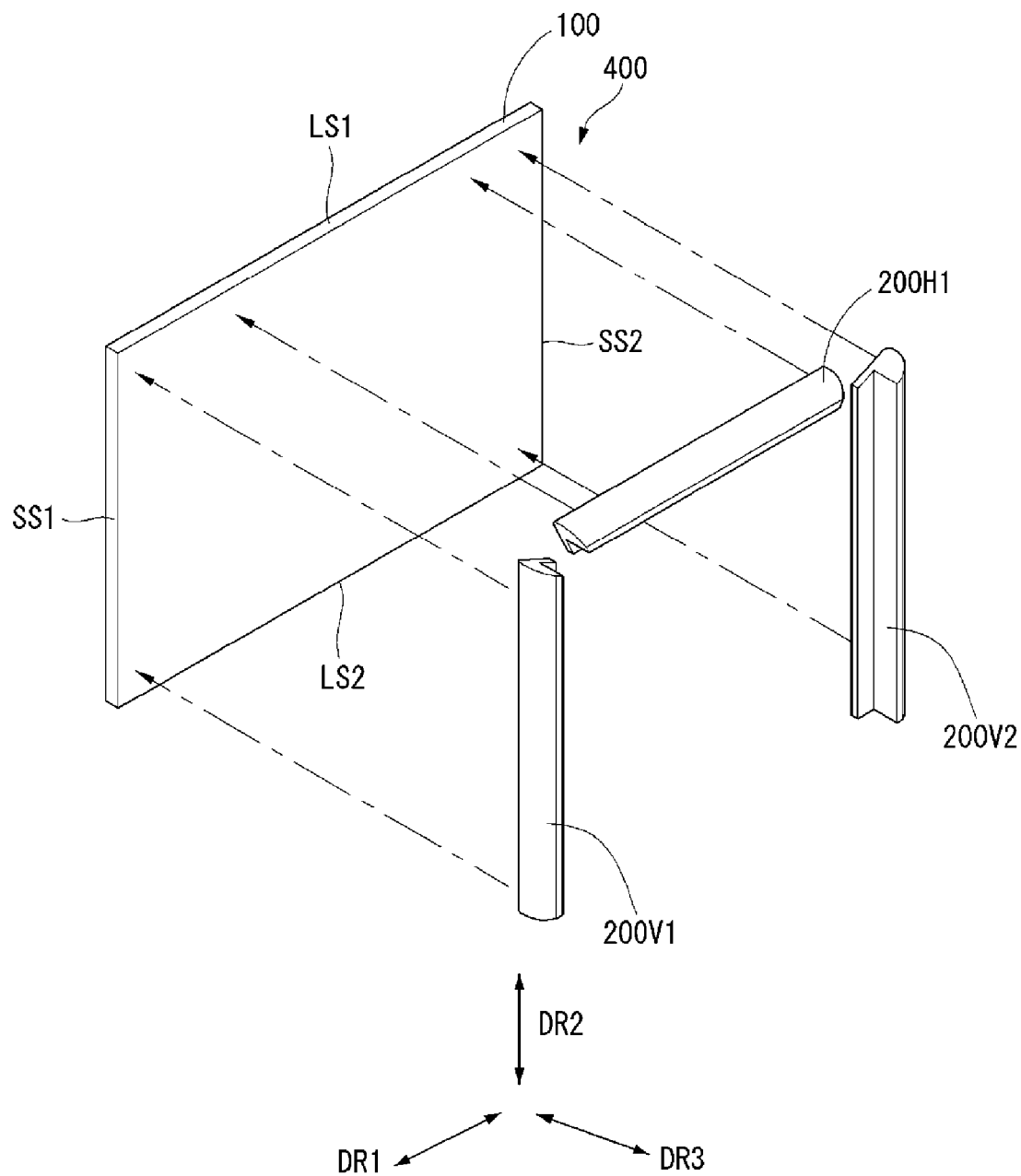
Figure 50:
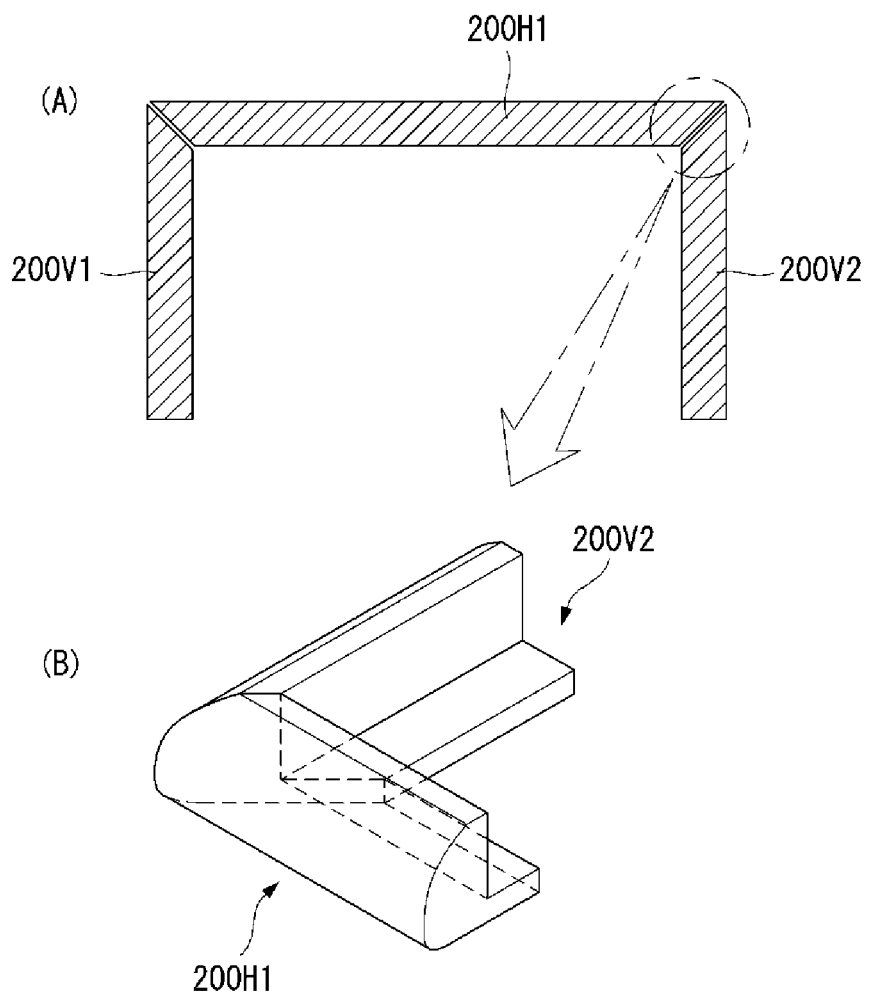

As shown in FIG. 49, the guide panel 200 may include a first horizontal guide panel 200H1 disposed on the first long side LS1 of the display panel 100, a first vertical guide panel 200V1 disposed on the first short side SS1 of the display panel 100, and a second vertical guide panel 200V2 disposed on the second short side SS2 of the display panel 100. In this instance, at least a portion of each of the first part 410 and the second part 420 of the film part 400 may be exposed to the first long side LS1, the first short side SS1, and the second short side SS2 of the display device 10.

Two adjacent ends of the guide panel 200 may be opposite to each other on the corner of the display device 10 in an oblique direction. For example, as shown in (A) and (B) of FIG. 50 and FIG. 51, an end of the first horizontal guide panel 200H1 and an end of the second vertical guide panel 200V2 may be opposite to each other on the corner of the display device 10 in an oblique direction. In this instance, the film part 400 may surely cover the guide panel 200 on the corner of the display device 10.

Figure 51:
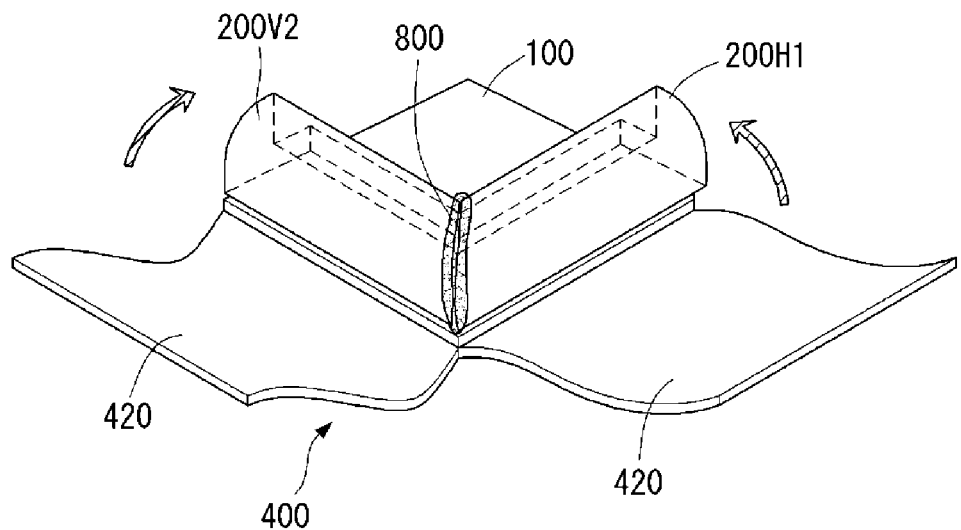

As shown in FIG. 51, the display device 10 may include a protective layer 800 covering two adjacent ends of the guide panel 200 which are opposite to each other on the corner of the display device 10 in the oblique direction.

The protective layer 800 may contain a resin material or a silicon material having the adhesion and the elasticity. Further, the protective layer 800 may contain a photosensitive material. Moreover, the first horizontal guide panel 200H1, the first vertical guide panel 200V1, and the second vertical guide panel 200V2 may form one body.

Figure 52:
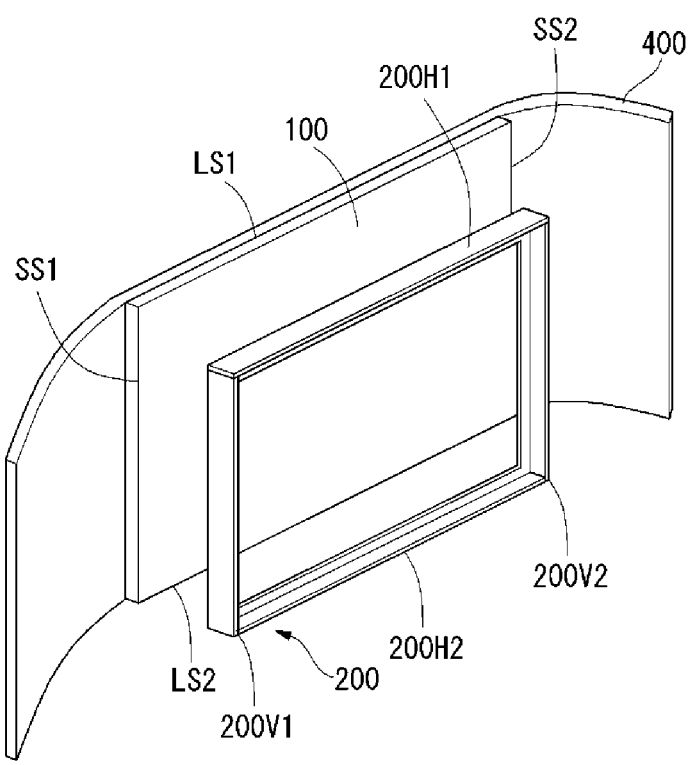

As shown in FIG. 52, the guide panel 200 may further include a second horizontal guide panel 200H2 disposed on the second long side LS2 of the display panel 100. In this instance, the first horizontal guide panel 200H1, the second horizontal guide panel 200H2, the first vertical guide panel 200V1, and the second vertical guide panel 200V2 may form one body.

The film part 400 may cover at least a portion of each of the first vertical guide panel 200V1 and the second vertical guide panel 200V2. However, the film part 400 may not cover the first horizontal guide panel 200H1 and the second horizontal guide panel 200H2. Hence, as shown in FIGS. 53 and 54, an external surface EXT of the first horizontal guide panel 200H1 may be exposed to the first long side LS1 of the display panel 100.

Figure 55:
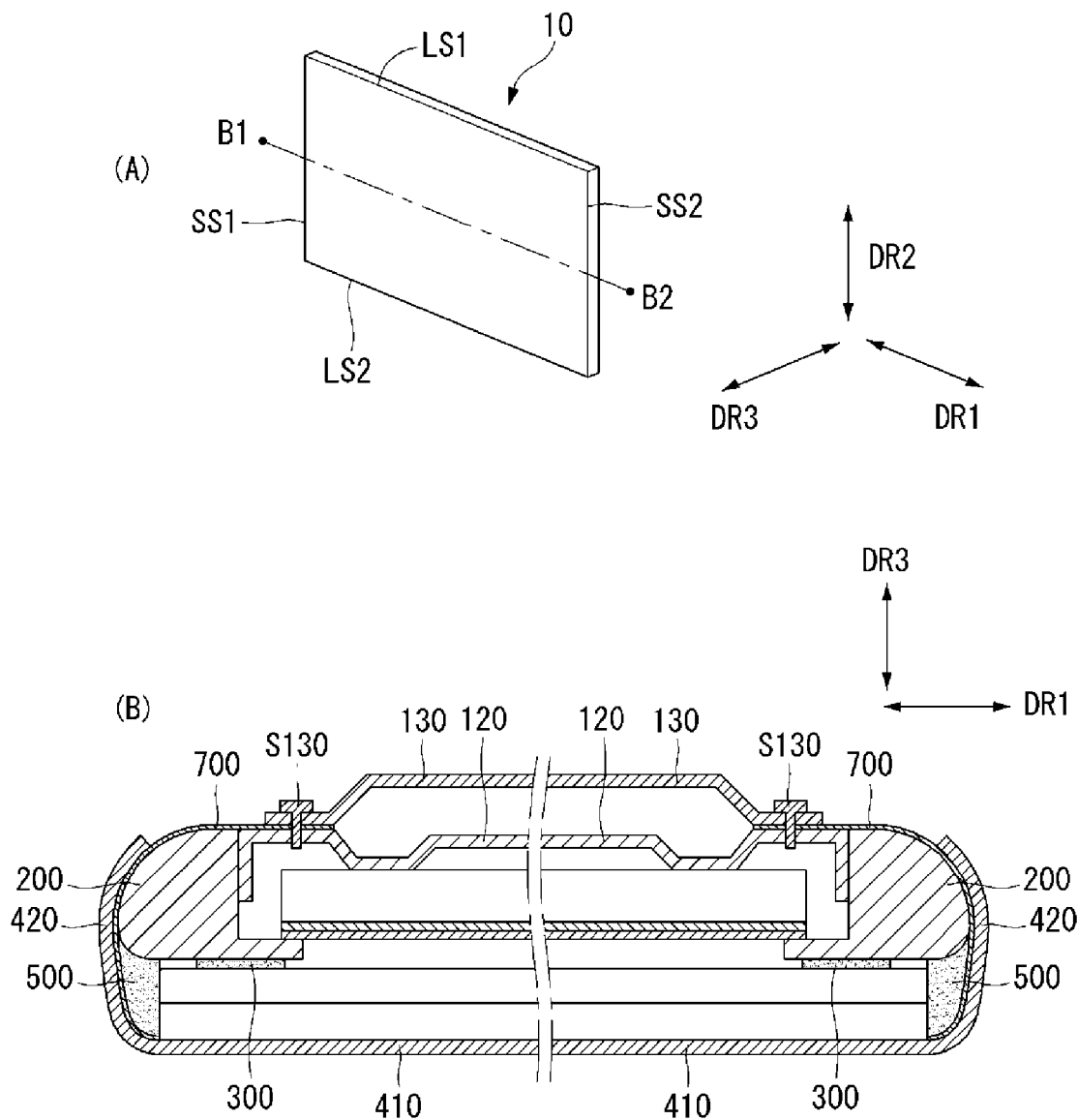

As shown in (B) of FIG. 55, which is a cross-sectional view of the display device 10 taken along line B1-B2 of (A) of FIG. 55, the second part 420 of the film part 400 may cover at least a portion of the side of the display module 10B on the first short side SS1 and the second short side SS2 of the display device 10. In other words, the second part 420 of the film part 400 may cover at least a portion of the guide panel 200 on the first short side SS1 and the second short side SS2 of the display device 10.

Further, at least a portion of each of the first part 410 and the second part 420 of the film part 400 may be exposed to the first short side SS1 and the second short side SS2 of the display device 10.

Figure 53:
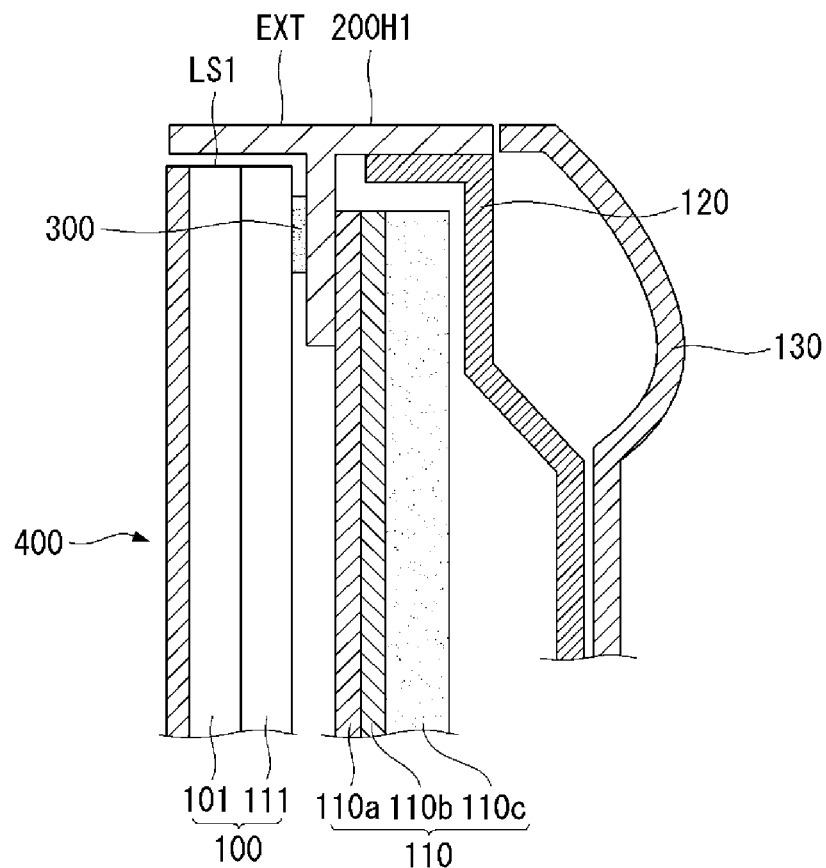
Figure 54:
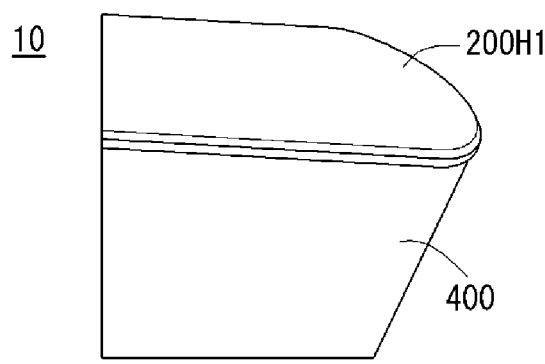
Figure 56:
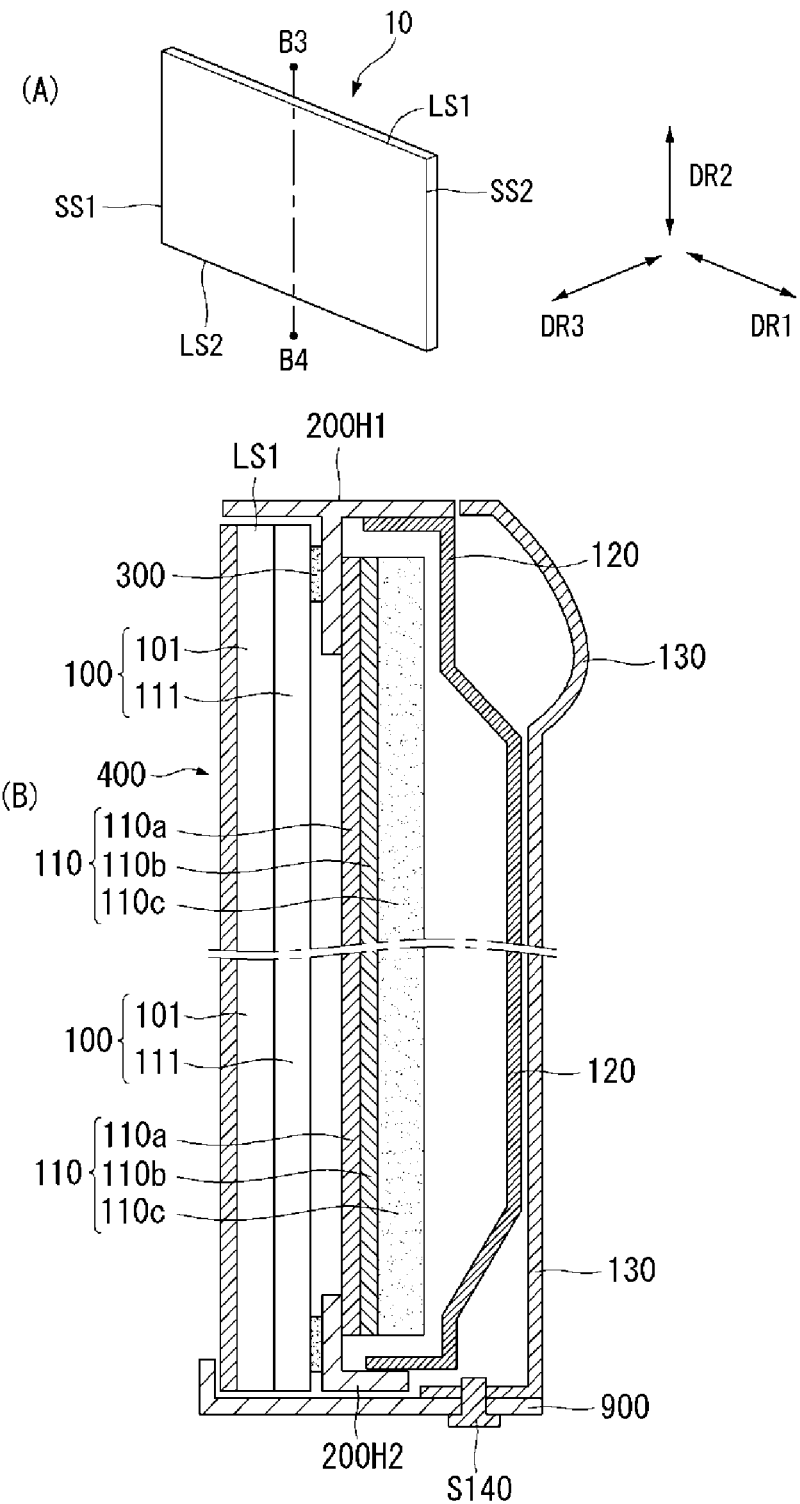

As shown in (B) of FIG. 56, which is a cross-sectional view of the display device 10 taken along line B3-B4 of (A) of FIG. 56, the external surface of the first horizontal guide panel 200H1 may be exposed to the first long side LS1 of the display device 10 in the same manner as FIG. 53.

A lower supporter 900 may support the display module 10B on the second long side LS2 of the display device 10. The lower supporter 900 may be fastened to the back cover 130 through a fifth fastening member S140. Further, the lower supporter 900 may cover at least a portion of an edge of the front surface of the display panel 100 on the second long side LS2 of the display panel 100.

As broadly described and embodied herein, provided is a display device having a thin profile and excellent visibility. In one aspect, a display device may include a display panel that includes a front substrate and a back substrate, a frame disposed in the rear of the display panel, a guide panel positioned adjacent to the frame, a back cover which is disposed in the rear of the display panel and is positioned adjacent to the frame, and a film part including a first part attached to a front surface of the display panel and a second part including a portion attached to the guide panel.

The guide panel may include a portion covering the side of the display panel. The guide panel may be attached to a back surface of the display panel. Moreover, the film part may include a polarizer.

A buffer with elasticity may be positioned between the guide panel and the film part. The guide panel may have a curved surface, and the second part of the film part may include a portion attached to the curved surface of the guide panel. The second part of the film part may further include a portion attached to a portion of the back cover.

An end of the back cover may correspond to the guide panel. The guide panel may include a groove, and the end of the back cover may correspond to the groove of the guide panel. The end of the back cover may cover a portion of the guide panel. Moreover, the guide panel may be completely covered.

The display device may further comprise a resin layer configured to commonly contact the side of the display panel, the guide panel, and the film part.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a display panel including a front substrate and a back substrate;
   a frame disposed behind the display panel;
   a guide panel configured to guide an edge of the display panel, and positioned adjacent to the frame;
   a back cover disposed behind the display panel and positioned adjacent to the frame; and
   a film part configured to transmit light to an active area of the display panel, and having a first portion that is attached to a front surface of the display panel and a second portion that extends from the first portion to surround a side of the display panel and attached to the guide panel,
   wherein the second portion of the film part covers at least a portion of an external surface of the back cover.

2. The display device of claim 1, wherein the guide panel includes a portion that covers the side of the display panel.

3. The display device of claim 1, wherein the guide panel is attached to a back surface of the display panel.

4. The display device of claim 1, wherein the film part includes a polarizer.

5. The display device of claim 1, wherein a buffer material having elasticity is provided between the guide panel and the film part.

6. The display device of claim 1, wherein the guide panel has a curved surface, and a prescribed region of the second portion of the film part is attached to the curved surface of the guide panel.

7. The display device of claim 6, wherein the curved surface extends laterally a prescribed distance beyond the side of the display panel such that the second portion of the film part extends to surround the side of the display panel at a prescribed distance away from the side of the display panel.

8. The display device of claim 1, wherein a prescribed region of the second portion of the film part is attached to the back cover.

9. The display device of claim 1, wherein an end of the back cover is positioned to correspond to a position of the guide panel.

10. The display device of claim 9, wherein the guide panel includes a groove and the end of the back cover is coupled in the groove of the guide panel.

11. The display device of claim 9, wherein the end of the back cover covers a portion of the guide panel.

12. The display device of claim 1, wherein the guide panel is completely covered.

13. The display device of claim 1, further comprising a resin layer configured to commonly contact the side of the display panel, the guide panel, and the film part.

14. The display device of claim 13, wherein at least a portion of the resin layer is provided lateral to the display panel to contact the side of the display panel.

15. The display device of claim 14, wherein the second portion of the film part surrounds the side of the display panel, the resin layer, and the guide panel.

16. The display device of claim 1, wherein the guide panel is provided along at least one edge of the display panel.

17. The display device of claim 16, wherein the guide panel is fixed to a back surface of the display panel along the at least one edge and provided to extend beyond the at least one edge by a prescribed distance.

18. The display device of claim 17, wherein the guide panel has a curved surface along the at least one edge of the display panel and configured to guide the second portion of the film part to wrap around the display panel.

19. The display device of claim 18, wherein the second portion of the film part wraps around the side of the display panel at a prescribed distance from the side of the display panel and at a prescribed curvature.

20. A display device comprising:
    a display panel;
    a frame disposed behind the display panel;
    a guide panel configured to guide an edge of the display panel, and disposed on a rear surface of the display panel, the frame being coupled to the guide panel;

a back cover disposed behind the display panel and the frame; and a film part configured to transmit light to an active area of the display panel, and provided to surround a front surface of the display panel, a side of the display panel, and at least a portion of the guide panel, wherein the guide panel has a prescribed shape that extends a prescribed distance past an edge of the display panel to guide the film part around the display panel, and wherein the second portion of the film part covers at least a portion of an external surface of the back cover.

* * * * *